(12) United States Patent
Losa et al.

(10) Patent No.: US 9,758,373 B2
(45) Date of Patent: Sep. 12, 2017

(54) METHOD FOR MANUFACTURING A PROTECTIVE LAYER AGAINST HF ETCHING, SEMICONDUCTOR DEVICE PROVIDED WITH THE PROTECTIVE LAYER AND METHOD FOR MANUFACTURING THE SEMICONDUCTOR DEVICE

(71) Applicant: STMicroelectronics S.r.l., Agrate Brianza (IT)

(72) Inventors: Stefano Losa, Cornaredo (IT); Raffaella Pezzuto, Surbo (IT); Roberto Campedelli, Novate Milanese (IT); Matteo Perletti, Vaprio d'Adda (IT); Luigi Esposito, Monte Sant'angelo (IT); Mikel Azpeitia Urquia, Sesto San Giovanni (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 14/262,437

(22) Filed: Apr. 25, 2014

(65) Prior Publication Data

US 2014/0231937 A1    Aug. 21, 2014

Related U.S. Application Data

(63) Continuation-in-part of application No. PCT/IB2012/055982, filed on Oct. 29, 2012.

(30) Foreign Application Priority Data

Oct. 28, 2011   (IT) .............................. TO2011A0989
Sep. 26, 2012   (IT) .............................. TO2012A0834

(51) Int. Cl.
*H01L 29/84*   (2006.01)
*B81C 1/00*    (2006.01)
*B81B 7/00*    (2006.01)

(52) U.S. Cl.
CPC ........ *B81C 1/00801* (2013.01); *B81B 7/0032* (2013.01); *B81C 1/00595* (2013.01);
(Continued)

(58) Field of Classification Search
CPC ............ B81C 1/00801; B81C 1/00595; B81C 2201/014; B81B 2201/0242; B81B 2201/0235; H01L 29/84
See application file for complete search history.

(56) References Cited

U.S. PATENT DOCUMENTS

2005/0250235 A1    11/2005  Miles et al.
2006/0056474 A1*    3/2006  Fujimoto ................ H01L 33/22
                                                372/43.01
(Continued)

FOREIGN PATENT DOCUMENTS

CN    101544349 A    9/2009
CN    101762971 A    6/2010
(Continued)

OTHER PUBLICATIONS

Tripp et al., "The mechanical properties of atomic layer deposited alumina for use in micro- and nano-electromechanical systems," *Sensors and Actuators A 130-131*:419-429, 2006.
(Continued)

*Primary Examiner* — Michele Fan
(74) *Attorney, Agent, or Firm* — Seed IP Law Group LLP

(57) ABSTRACT

A method for manufacturing a protective layer for protecting an intermediate structural layer against etching with hydrofluoric acid, the intermediate structural layer being made of a material that can be etched or damaged by hydrofluoric
(Continued)

acid, the method comprising the steps of: forming a first layer of aluminum oxide, by atomic layer deposition, on the intermediate structural layer; performing a thermal crystallization process on the first layer of aluminum oxide, forming a first intermediate protective layer; forming a second layer of aluminum oxide, by atomic layer deposition, above the first intermediate protective layer; and performing a thermal crystallization process on the second layer of aluminum oxide, forming a second intermediate protective layer and thereby completing the formation of the protective layer. The method for forming the protective layer can be used, for example, during the manufacturing steps of an inertial sensor such as a gyroscope or an accelerometer.

19 Claims, 20 Drawing Sheets

(52) U.S. Cl.
CPC .......... *B81B 2201/0235* (2013.01); *B81B 2201/0242* (2013.01); *B81C 2201/014* (2013.01); *B81C 2201/053* (2013.01)

(56) References Cited

U.S. PATENT DOCUMENTS

| | | | |
|---|---|---|---|
| 2006/0084275 | A1 | 4/2006 | You et al. |
| 2006/0180082 | A1 | 8/2006 | Iwamoto et al. |
| 2006/0278879 | A1 | 12/2006 | Busta |
| 2008/0001249 | A1* | 1/2008 | Sheen ............... H01L 21/76224 257/499 |
| 2009/0305478 | A1 | 12/2009 | Yang |
| 2010/0062224 | A1 | 3/2010 | Witvrouw et al. |
| 2010/0320548 | A1* | 12/2010 | Tsau ..................... B81C 1/0019 257/415 |
| 2011/0104882 | A1* | 5/2011 | Ono .................. H01L 21/28123 438/591 |
| 2011/0207283 | A1 | 8/2011 | Haukka et al. |
| 2012/0091522 | A1 | 4/2012 | Ozaki et al. |
| 2012/0313235 | A1* | 12/2012 | Chu ..................... B81B 3/0005 257/692 |
| 2014/0231937 | A1 | 8/2014 | Losa et al. |

FOREIGN PATENT DOCUMENTS

| | | |
|---|---|---|
| DE | 102010000864 A1 | 7/2011 |
| EP | 1 083 144 | 3/2001 |
| EP | 2 259 019 | 12/2010 |
| WO | 2008/053008 A2 | 5/2008 |

OTHER PUBLICATIONS

Wallin et al., "Influence of residual water on magnetron sputter deposited crystalline $Al_2O_3$ thin films," *Thin Solid Films* 516:3877-3883, 2008.

Groner et al., "Low-Temperature $Al_2O_3$ Atomic Layer Deposition," Chem. Mater. 16:639-645, 2004.

Groner et al., "Gas diffusion barriers on polymers using $Al_2O_3$ atomic layer deposition," Applied Physics Letters 88(051907):88-90, 2006.

George, Steven M., "Atomic Layer Deposition: An Overview," Chem. Rev. 110:111-131, 2010.

Tang et al., "Novel Polymeric Protective Coatings for Hydrofluoric Acid Vapor Etching During MEMS Release Etch," IMAPS Device Packaging Converence, pp. 76-80, 2010.

Hoivik et al., "Atomic layer deposited protective coatings for micro-electromechanical systems," Sensors and Actuators A(103):100-108, 2003.

Mayer et al., "Atomic-layer deposition of wear-resistant coatings for microelectromechanical devices," Applied Physics Letters 82(17):2883-2885, Apr. 28, 2003.

Herrmann et al., "Conformal hydrophobic coatings prepared using atomic layer deposition seed layers and non-chlorinated hydrophobic precursors," J. Micromech. Microeng. 15:984-992, 2005.

Puurunen, R., "Surface chemistry of atomic layer deposition: a case study for trimethylaluminum/water process," Journal of Applied Physics 97(12), 55 pgs., 2005.

Bakke et al., "Etch Stop Materials for Release by Vapor HF Etching," Proc. MicroMechanics Eur. Workshop, vol. 16, pp. 103-106, 2005.

DelRio, F. et al., "Atomic Layer Deposition of $Al_2O_3$/ZnO Nanoscale Films for Gold RF MEMS," 2004 IEEE MTT-S International Microwave Symposium Digest, Fort Worth, TX, p. 1923-1926.

Dawson, N. M., "Atomic Layer Deposition of Aluminum Oxide," thesis, University of California—Santa Cruz, May 30, 2010, 28 pgs.

* cited by examiner

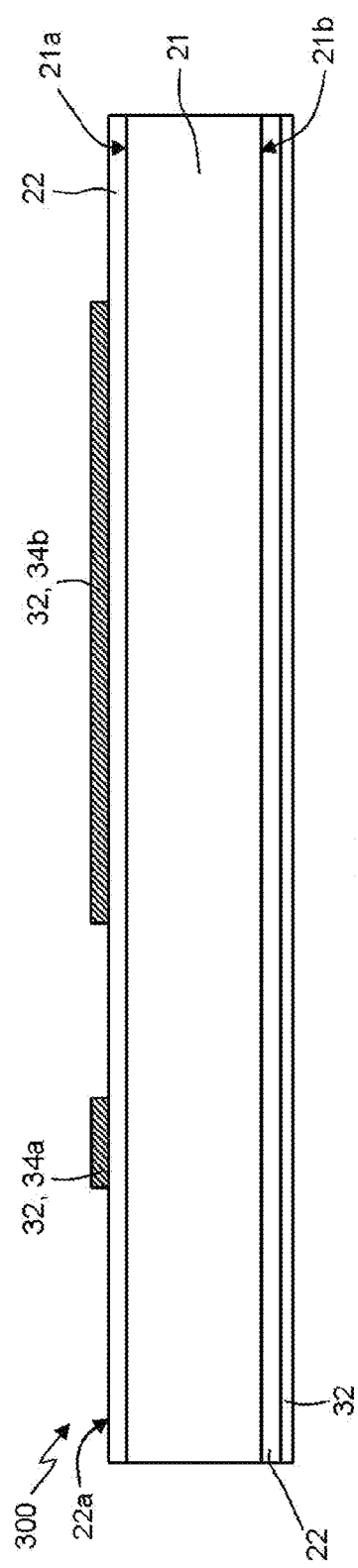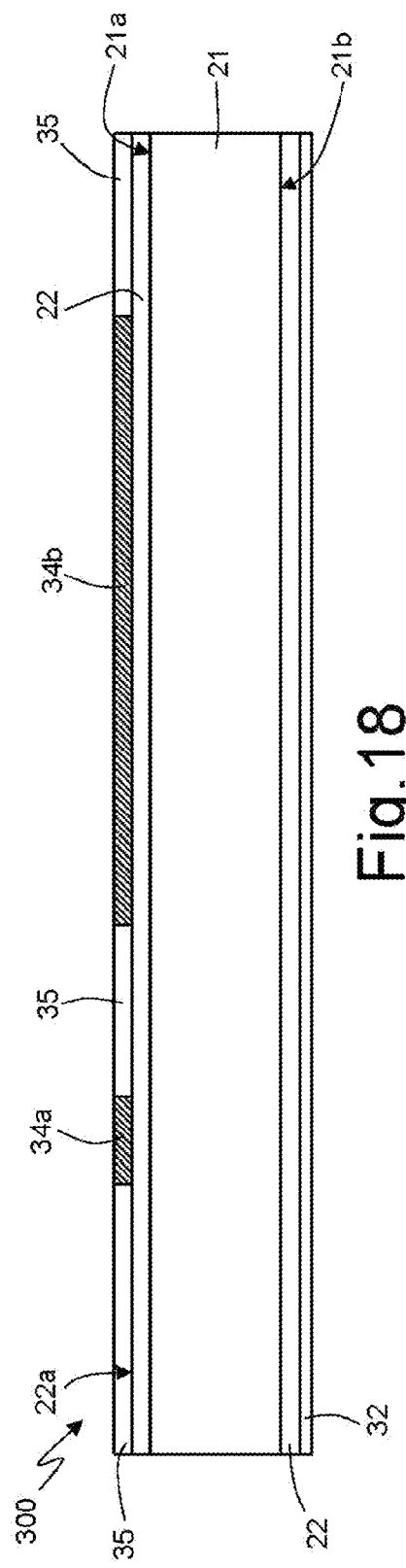

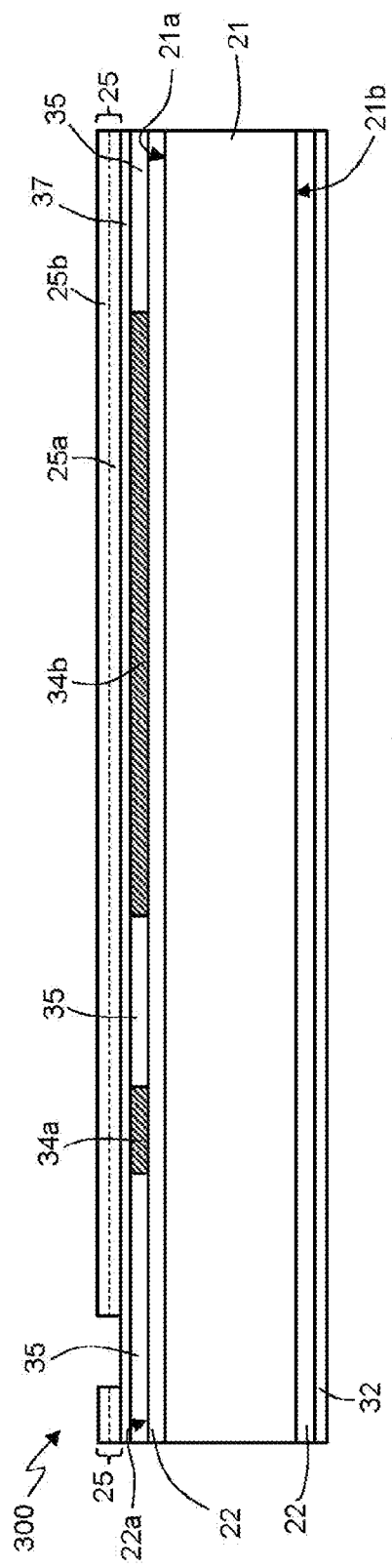
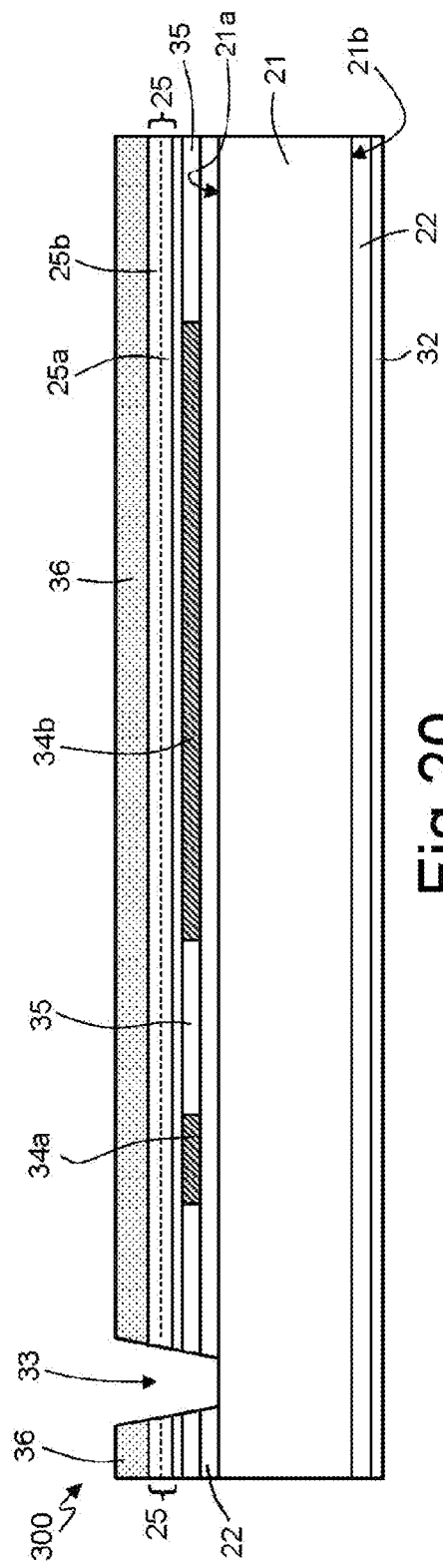
Fig.19
Fig.20

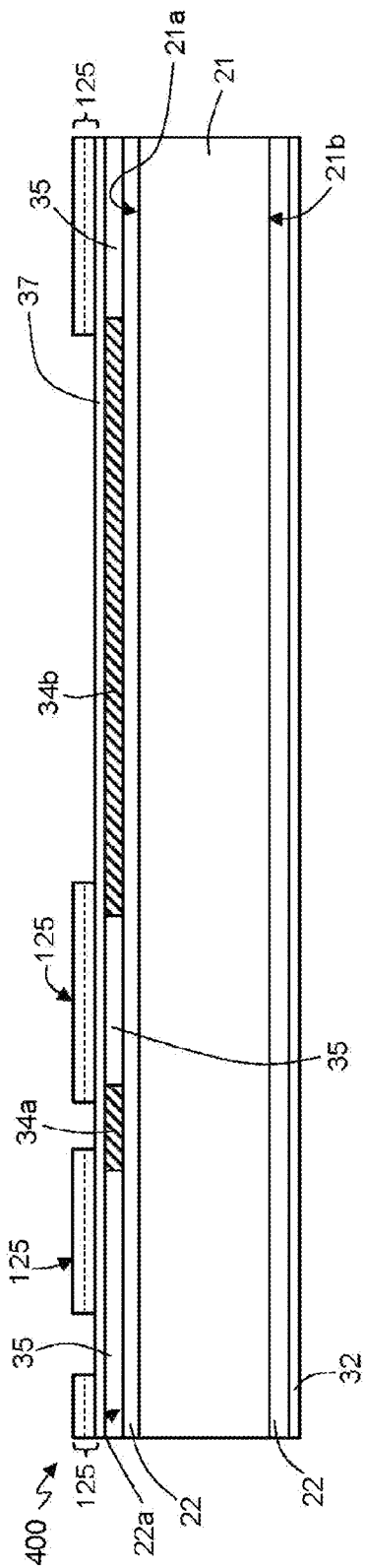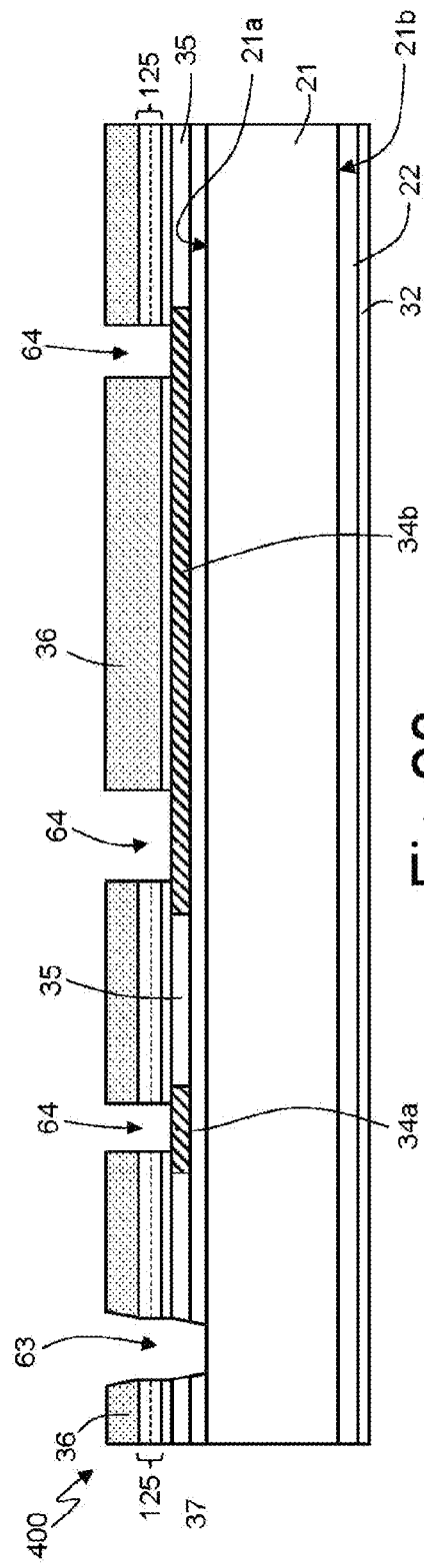

METHOD FOR MANUFACTURING A PROTECTIVE LAYER AGAINST HF ETCHING, SEMICONDUCTOR DEVICE PROVIDED WITH THE PROTECTIVE LAYER AND METHOD FOR MANUFACTURING THE SEMICONDUCTOR DEVICE

BACKGROUND

Technical Field

The present disclosure relates to a method for manufacturing a protective layer against etching with hydrofluoric acid (HF), a semiconductor device provided with the protective layer and utilization of the method for manufacturing the protective layer to make a semiconductor device.

Description of the Related Art

Surface micromachining occupies an important position in known manufacturing techniques for semiconductor devices, microelectronic devices and micro-electro-mechanical systems (MEMS). The manufacture of free-standing structures by micromachining surfaces comprises forming, on a substrate, structural layers partially overlapping sacrificial layers. Subsequent selective etching enables the sacrificial layers exposed to the etching solution to be removed to release the structural layers and form the free-standing structures.

FIGS. 1-6 show the manufacturing steps of an inertial sensor 1, in particular a gyroscope, according to a known process. In particular, a process is shown for forming the free-standing structures of the stator and rotor, in epitaxial polysilicon (also known as "EPIPoly"), above a silicon substrate that houses conductive strips in polysilicon able to form electrical connections to and from the free-standing structures.

With reference to FIG. 1, according to a method of manufacture of known type for making a gyroscope, a silicon substrate 1 is provided. A silicon oxide support layer 2 is then formed, through thermal growth for example. This support layer 2 is also known as the permanent or field oxide layer and has an approximate thickness of between 2 and 3 µm. The support layer 2 has the function of supporting the overlying structures (formed in a subsequent step) and is capable of reducing parasitic capacitance between these overlying structures and the underlying substrate 1.

A layer of doped polysilicon (N-type for example) is formed over the support layer 2, which is subsequently etched to remove selective portions of the polysilicon and form electrical contact regions 4a, 4b. The electrical contact regions 4a, 4b are conductive strips and form, as will be further explained in the subsequent manufacturing steps, electrical interconnections. The etching of the polysilicon layer, to form the electrical contact regions 4a, 4b, is of the selective type and does not remove portions of the support layer 2. As previously mentioned, the support layer 2 has the function of electrically insulating the electrical contact regions 4a, 4b from the substrate 1 and reducing parasitic capacitances on the latter.

Then, FIG. 2, a sacrificial layer 6 of silicon oxide is formed (for example, by PECVD) over the support layer 2 and the electrical contact regions 4a, 4b. Portions of the sacrificial layer 6 from over the underlying electrical contact regions 4a, 4b are removed through lithographic steps and subsequent etching, forming pluralities of trenches 8 that extend towards the electrical contact regions 4a, 4b, so as to expose respective surface portions of the electrical contact regions 4a, 4b. In particular, two trenches 8 are formed over the electrical contact region 4b.

During the step in FIG. 2, a trench 9 is also formed that extends though the sacrificial layer 6 and the support layer 2, until the upper surface of the substrate 1 is reached and exposed. In subsequent manufacturing steps, this trench provides the passage for forming a ground terminal in electrical contact with the substrate 1.

Then, FIG. 3, a structural layer 10, for example of epitaxial polysilicon ("EPIPoly"), is formed over the sacrificial layer 6 and in the trenches 8, 9, extending in trenches 8 to make electrical contact with the electrical contact regions 4a, 4b, and in trench 9 to make electrical contact with the substrate 1. The structural layer 10 can be processed as needed, to form structures having a desired conformation.

In FIG. 4, the structural layer 10 is selectively etched to form free-standing structures movable in one or more directions (a stator 11 and a rotor 12), lateral walls 13 able to delimit a chamber 14 that houses the stator 11 and the rotor 12, and electrical contact terminals 15 outside of the chamber 14 (only one electrical contact terminal 15 ("pad") is shown in FIG. 4).

However, it should be noted that in this manufacturing step, the stator 11 and rotor 12 are still constrained to the underlying sacrificial layer 6 and therefore are not free to move. Through holes 18 are also formed in the structure of the stator 11 and the rotor 12 to enable the removal, in subsequent manufacturing steps, of the sacrificial layer 6, so as to partially suspend the stator 11 and the rotor 12. This process step is shown in FIG. 5, where the stator 11 and rotor 12 are rendered free-standing by removing portions of the sacrificial layer 6 that extend beneath them. The portions of the stator 11 and the rotor 12 that, in FIG. 4, extend into the trenches 8 form, in FIG. 5, support bases 16, 17 for the stator 11 and the rotor 12, respectively. These support bases 16, 17 are also in electrical contact with the underlying electrical contact regions 4a, 4b.

As can be noted in FIG. 5, part of the sacrificial layer 6 remains beneath portions of the lateral walls 13, to support them and provide adequate electrical insulation of the lateral walls from the electrical contact region 4b.

In addition, to protect portions of the electrical contact region 4b that remain exposed to the outside environment at the end of the manufacturing steps, a silicon nitride (SiN) depositing step is performed to cover and protect the electrical contact region 4b (the protective layer 3 can be seen in FIG. 5).

Finally, FIG. 6, the manufacture of the inertial sensor (here, for example, a gyroscope) is completed by placing a cap 19 on, and in contact with, the lateral walls 13. The cap 19 and the lateral walls 13 are coupled to each other by solder material 20, of the conductive or insulating type according to preferences. In this way, the chamber 14 is insulated to protect the stator 11 and the rotor 12 and, in general, all of the elements (movable and fixed parts) that form the gyroscope and are not shown here in detail. As mentioned, there are electrical contact terminals 15 outside the chamber 14 that are electrically connected to respective electrical contact regions 4a, 4b to receive/feed electrical signals from/to the stator 11 and rotor 12.

The etching step to remove the portions of the sacrificial layer 6 (of silicon oxide) that extend beneath the stator 11 and rotor 12 is typically etching using hydrofluoric acid (HF) in the vapor phase or, alternatively, wet etching using an HF solution or mixture. The hydrofluoric acid etches the silicon oxide in an isotropic manner, but not the polysilicon. Therefore, stator 11 and rotor 12 are not damaged. The etching of the sacrificial layer 6 with HF can be halted in a region close to the interface between the sacrificial layer 6 and the support layer 2 by knowing the etching rate and monitoring the etching time; alternatively, the another solution is to use an etch stop layer, arranged between the sacrificial layer 6 and the support layer 2, chosen in a material that is etch-resistant to HF and which does not allow HF to penetrate through it.

However, the first solution (monitoring the etching time) is not optimal and, in general, is not applicable, as complete and uniform removal of the sacrificial layer 6 cannot be ensured in all situations.

The second solution is not, in actual fact, practicable or practiced, as known HF-resistant materials exhibit a series of other contraindications.

For example, silicon carbide (SiC), silicon-germanium (SiGe) and polysilicon-germanium (Poly SiGe) are materials that can be used as an etch stop layer, because they are resistant to hydrofluoric acid.

Other materials, such as silicon nitride (SiN), are not resistant to hydrofluoric acid. In particular, when using HF vapor etching, in addition to being removed, SiN forms salts with the hydrofluoric acid vapors that cause high defect rates in the final structure. The use of SiC, for example deposited using PECVD (Plasma-Enhanced Chemical Vapor Deposition), although giving resistance against HF etching in certain conditions, does not provide suitable impermeability to HF because, if deposited on defined structures, it can give rise to micro-cracks. Infiltrations of hydrofluoric acid can thus occur through the SiC layer, which cause etching of the underlying support layer 2. SiC also has other undesired characteristics that appear, in particular, after any annealing that may be performed by the manufacturing steps following deposition of the SiC layer. In particular, reduced adhesion of SiC to silicon oxide and a change in the insulating properties of SiC, which acquires a conductive behavior, have been observed after annealing.

SiGe, although both resistant to HF etching and impermeable to HF, typically requires a high level of purity (absence of doping impurities). Vice versa, the diffusion of any doping species drastically reduces the dielectric constant value of SiGe, making it unsuited to applications (as in the case shown on FIGS. 1-6) in which high electrical insulation is desired between the electrical contact regions 4a, 4b and the underlying layers. A similar discourse holds for polysilicon-germanium.

In consequence, to ensure complete etching of the sacrificial layer 6 without jeopardizing the electrical and structural characteristics of the other layers, it is normally preferred to completely etch the sacrificial layer 6 and partially etch the support layer 2. As HF etching is of the isotropic type, a phenomenon of etching beneath electrical contact regions 4a, 4b (known as underetch or undercut) is observed, which creates free-standing peripheral portions of the electrical contact regions 4a, 4b (generically indicated in FIG. 6 by reference numeral 4'). This fact can cause problems of weakening or possible breakage of the free-standing portions 4'. This results in an intrinsic design limit on the size of the electrical contact regions 4a, 4b that, in order to contain underetch and therefore the portion of free-standing region, does not allow the size of the electrical contact regions 4a, 4b to be reduced (or rather, there is a limit on rescaling the device). In fact, for very narrow electrical contact regions 4a, 4b, underetch could cause irreparable damage to the support layer 2 beneath them. Furthermore, there are also layout complications that take the size and extent of underetch into account to avoid them becoming excessive.

As well as being a limit to reducing the size of the device, the free-standing regions 4' are mechanically fragile and can break in cases where there is contact with the overlying moving structures, situations that typically occur if the devices are in free fall (which can happen, depending on their application) or severe impacts.

The problems described herein can also be encountered in the case of generic inertial sensors, different from the gyroscope, such as accelerometers for example, or devices equipped with a free-standing mass in general.

BRIEF SUMMARY

One or more embodiments of the present disclosure are directed to a method for manufacturing a protective layer against etching with hydrofluoric acid (HF) and a semiconductor device equipped with the protective layer are provided. In one embodiment, the semiconductor device is a MEMS device, such as an inertial sensor, and the protective layer is adapted to protect underlying layers from the hydrofluoric acid used to remove a sacrificial layer over the protective layer.

BRIEF DESCRIPTION OF THE DRAWINGS

For a better understanding of the present disclosure, some preferred embodiments will now be described, purely by way of a non-limitative example and with reference to the attached drawings, where:

FIGS. 17-25 show, in cross-section, a wafer during steps of a method for manufacturing an inertial sensor, in particular a gyroscope, according to an embodiment of the present disclosure;

FIGS. 27-30 show, in cross-section, a wafer during steps of a method for manufacturing an inertial sensor, in particular a gyroscope, according to a further embodiment of the present disclosure.

DETAILED DESCRIPTION

According to one aspect of the present disclosure, a method is provided to form a protective layer resistant and impermeable to hydrofluoric acid (HF).

Figure 7:
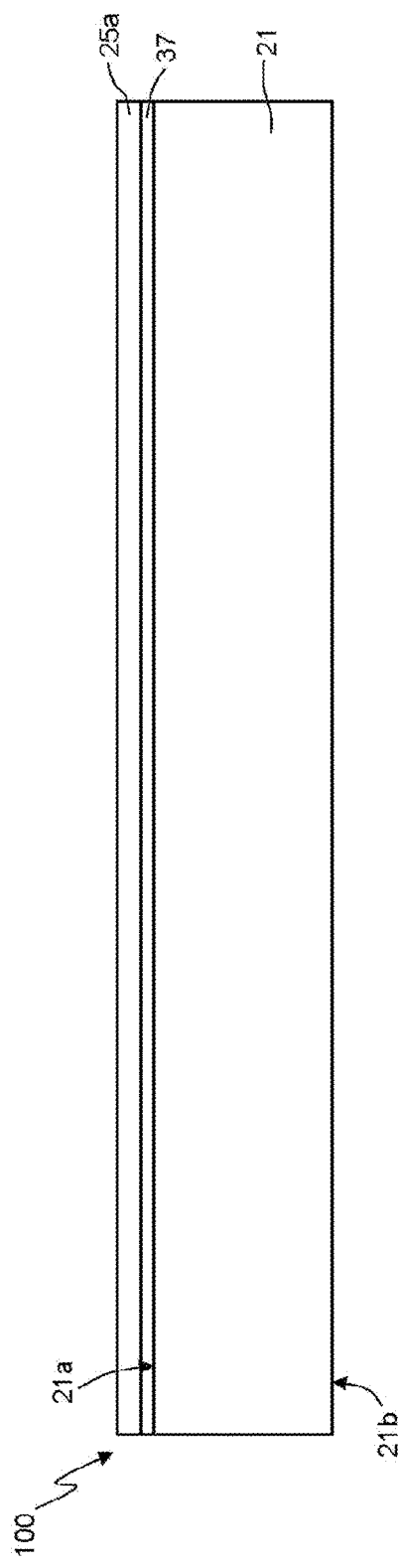
FIGS. 7 and 8 show, in cross-section, a wafer during manufacturing steps of a protective layer against etching with hydrofluoric acid, according to an embodiment of the present disclosure.
Figure 8:
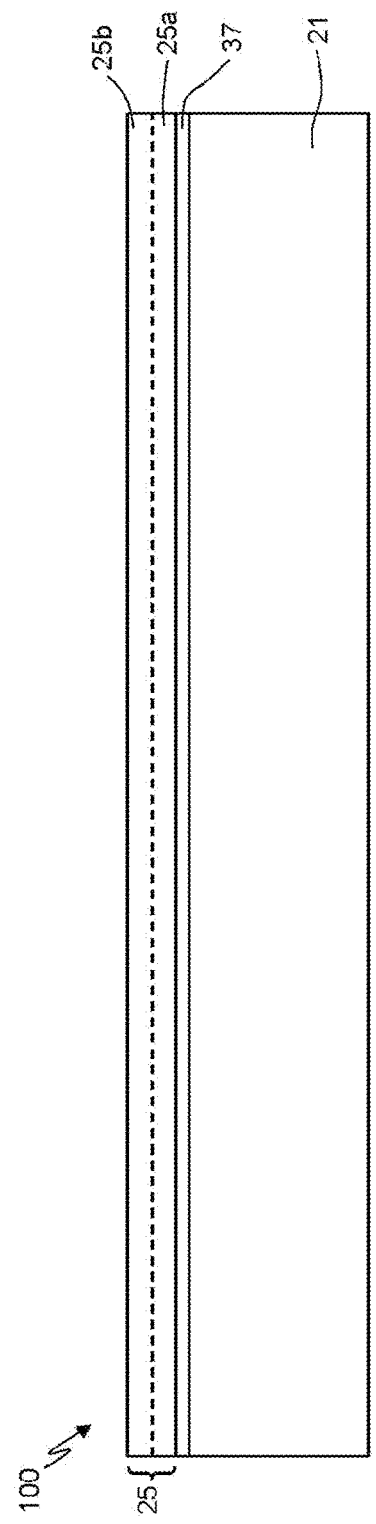

This protective layer, identified in FIGS. 7 and 8 by reference numeral 25, is formed by successive deposits of alumina ($Al_2O_3$) using an atomic layer deposition (ALD) process.

The atomic layer deposition (ALD) of $Al_2O_3$ is in itself known in the literature, for example Steven M. George, *Chem. Rev.* 2010, 110, p. 111-131, or Puurunen, R. L., *J. Appl. Phys.* 2005, 97, p. 121-301.

The deposition of $Al_2O_3$ by ALD is typically carried out by using trimethylaluminium (TMA, $Al(CH_3)_3$) and water vapor ($H_2O$) as reagents. In alternative to $H_2O$ vapor, it is possible to use ozone ($O_3$). Hereinafter, reference will be made to the deposition steps using TMA as the source of aluminium and $H_2O$ as the oxidant. It is clearly understood that possible known variants of the process described hereinafter can be used for the formation of the protective layer 25.

The following description of the formation of the protective layer 25 refers to the deposition of the protective layer 25 on a wafer 100. In particular, the wafer 100 comprises a substrate 21, for example, of a semiconductor material; the wafer 100 can be of a previously processed type.

Prior to the deposition of $Al_2O_3$, the wafer 100 is subjected to a surface treatment (for example, by oxidation, special washing, or plasma treatment) in order to optimize $Al_2O_3$ adhesion. The above-mentioned surface treatment is illustrated in FIG. 7 by a thin silicon oxide layer 37 that covers a first side 21a of the substrate 21.

The wafer 100 is inserted in a reaction chamber (various types of ALD reactors are known and utilized). The ambient temperature inside the reaction chamber is brought to a value of between approximately 150° and 400° C., for example, approximately 300° C.

Reagents are introduced into the reaction chamber according to a scheme of pulses in timed succession. First of all, a first reagent, typically $H_2O$ vapor, is introduced into the reaction chamber. The $H_2O$ vapor reacts with the exposed surface of the wafer 100, forming hydroxyl groups ($OH^-$). In the particular case of FIG. 7, since the exposed surface of the wafer 100, above the surface 21a of the substrate 21, is covered by the silicon oxide layer 37 (which already has exposed hydroxyl groups $OH^-$), the $H_2O$ pulse can be omitted. In the case where the formation process of the protective layer 25 takes place starting from a surface that does not have exposed hydroxyl groups $OH^-$, the $H_2O$ vapor pulse is advisable to aid the formation of hydroxyl groups on the surface (formation of silane groups SiOH on silicon).

Nitrogen ($N_2$) gas is introduced into the reaction chamber, with a pulse lasting between approximately 200 and 3500 ms. This second pulse is not necessary for the purposes of forming the $Al_2O_3$ layer, but has the function of aiding the purging of $H_2O$ molecules from the reaction chamber that have not taken part in the formation of the hydroxyl groups on the surface, in order to avoid reactions in the gas step, and promoting those utilized for the surface hydroxyl groups.

By means of a third pulse lasting between 150 and 200 ms, a second reagent, in particular trimethylaluminium (TMA), is introduced into the reaction chamber. The amount of TMA introduced varies according to the specific operating conditions. In general, it is advisable to introduce TMA in sufficient quantity to enable the subsequent reaction of TMA molecules with all the hydroxyl groups present on the exposed surface of the silicon oxide layer 37. TMA reacts with the hydroxyl groups, generating methane ($CH_4$) as a product of the reaction. The reaction is described by the following formula (1):

$$SiOH + Al(CH_3)_3 \rightarrow SiOAl(CH_3)_2 + CH_4 \qquad (1)$$

The SiOH and $SiOAl(CH_3)_2$ species are formed on the surface of the silicon oxide layer 37. Reaction (1) is self-limiting as the number of surface sites where reaction (1) occurs is finite. In this way, a uniform monolayer of $SiOAl(CH_3)_2$ is formed on the surface of the silicon oxide layer 37.

Nitrogen ($N_2$) gas is introduced into the reaction chamber again, with a pulse lasting between approximately 150 and 3500 ms. This second pulse, optional for the purposes of forming the $Al_2O_3$ layer, also has a purging function, aiding removal from the reaction chamber of the methane generated as a product of reaction (1) and excess TMA that has not taken part in reaction (1).

The process is repeated, with the introduction of $H_2O$ vapor into the reaction chamber (with a pulse lasting the same time as the first pulse).

The $H_2O$ vapor reacts with the free methyl groups present on the surface of the silicon oxide layer 37 after reaction (1), forming aluminium-oxygen (Al—O) bridges and surface hydroxyl groups. Methane is the product of the reaction in this case as well. This reaction is qualitatively described by the following formula (2):

$$2H_2O + SiOAl(CH_3)_2 \rightarrow SiOAl(OH)_2 + 2CH_4 \qquad (2)$$

The excess methane generated following the reaction (2), as well as any excess $H_2O$ vapor, is purged from the reaction chamber by introducing $N_2$ into the reaction chamber (pulse lasting between approximately 200 and 3500 ms).

TMA is introduced into the reaction chamber (pulse lasting between approximately 150 and 200 ms). The TMA reacts with the hydroxyl groups present on the surface of the silicon oxide layer 37 and bound to atoms of aluminium (AlOH), according to the following reaction (3):

$$AlOH + Al(CH_3)_3 \rightarrow AlOAl(CH_3)_2 + CH_4 \qquad (3)$$

The SiOH and $AlOAl(CH_3)_2$ species are surface species. Reaction (3) is self-limiting.

A new $N_2$ pulse aids purging the reaction chamber of the products generated by the previous reaction.

Further introduction of $H_2O$ vapor into the reaction chamber (pulse lasting between approximately 200 and 500 ms, similar to that previously illustrated) causes the following reaction (4):

$$AlCH_3 + H_2O \rightarrow AlOH + CH_4 \qquad (4)$$

The $AlCH_3$ and AlOH species are surface species. Reaction (4) is also self-limiting.

The process continues by repeating the steps of reactions (3) and (4), which define a complete formation cycle of $Al_2O_3$ on the silicon oxide layer 37.

The complete reaction that describes the depositing of aluminium oxide ($Al_2O_3$) by ALD is the following:

$$2Al(CH_3)_3 + 3H_2O \rightarrow Al_2O_3 + 3CH_4 \qquad (5)$$

During each cycle, an $Al_2O_3$ layer of approximately 0.08-0.1 nm is grown. The cycles of reaction (3) and (4) continue until a first intermediate layer 25a is obtained with a thickness of between approximately 10 and 60 nm, in particular between approximately 15 and 40 nm and, still more particularly, equal to approximately 20 nm.

The thickness of the first intermediate layer 25a can be measured using spectrophotometric techniques (for example, an ellipsometer).

An annealing step is carried out on the wafer 100 at a temperature between approximately 800° and 1100° C., in particular equal to approximately 1030° C., to aid the crystallization of the first intermediate layer 25a, of $Al_2O_3$, formed as previously described. This annealing step can be of the RTP (rapid thermal process) type for a period of between approximately 10 seconds and 2 minutes in $N_2$ or $O_2$, at a temperature of between approximately 1000° and approximately 1100° C. For example, annealing could be carried out for a period of approximately 15 seconds in $N_2$ at approximately 1030° C. Alternatively, annealing can be carried out in a furnace for a period of between approximately 10 minutes and 90 minutes, at between 800° and 1100° C. in $N_2$ and/or $O_2$, preferably at 900° C. for 30 minutes in $N_2$.

Following the crystallization of the first intermediate layer 25a, manufacturing proceeds, FIG. 8, with the formation of a second intermediate layer 25b, over the first intermediate layer 25a.

The second intermediate layer 25b is a layer of aluminium oxide ($Al_2O_3$) similar to the first intermediate layer 25a.

The steps of forming the second intermediate layer 25b are the same as those already described with reference to the formation of the first intermediate layer 25a, and are therefore not described in their entirety. The second intermediate layer 25b is thus formed by atomic layer deposition (ALD), comprising consecutive formation cycles of $Al_2O_3$ monolayers as described with reference to reactions (3) and (4).

In greater detail, after having placed the wafer 100 in the reaction chamber, at a temperature of between approximately 200° and 400° C., for example equal to approximately 300° C., a first reagent (for example, $H_2O$ vapor, although ozone $O_3$ can be used as already mentioned) is introduced into the reaction chamber.

The introduction of $H_2O$ vapor into the reaction chamber (pulse lasting between approximately 200 and 500 ms) causes the following reaction (i.e., the previously described reaction 4):

$$AlCH_3 + H_2O \rightarrow AlOH + CH_4,$$

where the $AlCH_3$ and $AlOH$ species are surface species.

The introduction of TMA into the reaction chamber (pulse lasting between approximately 150 and 200 ms) causes the following reaction (i.e., the previously described reaction 3):

$$AlOH + Al(CH_3)_3 \rightarrow AlOAl(CH_3)_2 + CH_4,$$

where the $SiOH$ and $AlOAl(CH_3)_2$ species are surface species.

The cycle resumes until the formation of a second intermediate layer 25b is obtained with a thickness of between approximately 10 and 60 nm, in particular between approximately 15 and 40 nm, and even more particularly, equal to approximately 20 nm.

It is possible to have $N_2$ pulse steps between the illustrated reactions (as already described with reference to the formation of the first intermediate layer 25a), to enable cleaning of the reaction chamber.

An annealing step is carried out on the wafer 100 at a temperature between approximately 800° and 1100° C., in particular equal to approximately 1030° C., to aid the crystallization of the second intermediate layer 25b, of $Al_2O_3$, formed as described. This annealing step can be of the RTP (rapid thermal process) type for a period of between approximately 10 seconds and 2 minutes in $N_2$ or $O_2$, at between 1000° and 1100° C. (for example equal to approximately 15 seconds in $N_2$ at approximately 1030° C.). Alternatively, annealing can be carried out in a furnace for a period of between approximately 10 minutes and 90 minutes, at between 800° and 1100° C. in $N_2$ and/or $O_2$, and preferably at 900° C. for 30 minutes in $N_2$.

In this way, the protective layer 25 is formed, comprising the first and the second intermediate layers 25a, 25b, formed as described.

The applicant has verified that a layer of alumina $Al_2O_3$ formed according to the following steps (i)-(iv):

(i) deposition of a first layer of $Al_2O_3$ using an ALD process, (ii) crystallization of the first layer of $Al_2O_3$, (iii) deposition of a second layer of $Al_2O_3$ over (and in particular, in direct contact with) the first layer of crystallized $Al_2O_3$ using an ALD process, and (iv) crystallization of the second layer of $Al_2O_3$, confers the protective layer 25 with resistance against etching by hydrofluoric acid (HF) and, in particular, impermeability of the protective layer 25 to hydrofluoric acid. In addition, the applicant has verified that the so-formed protective layer 25 exhibits excellent properties of adhesion to the underlying layer of silicon oxide, exhibits excellent dielectric properties that do not change as a consequence of any subsequent annealing, exhibits little variation in the radius of curvature (warpage) of the wafer 100, is compatible with the standard equipment used in the microelectronics industry and possesses high compatibility with high-temperature thermal processes (above 1000° C.).

FIGS. 9-16 show steps of a method for manufacturing a free-standing structure, belonging to an inertial sensor for example, according to an embodiment of the present disclosure.

Figure 9:
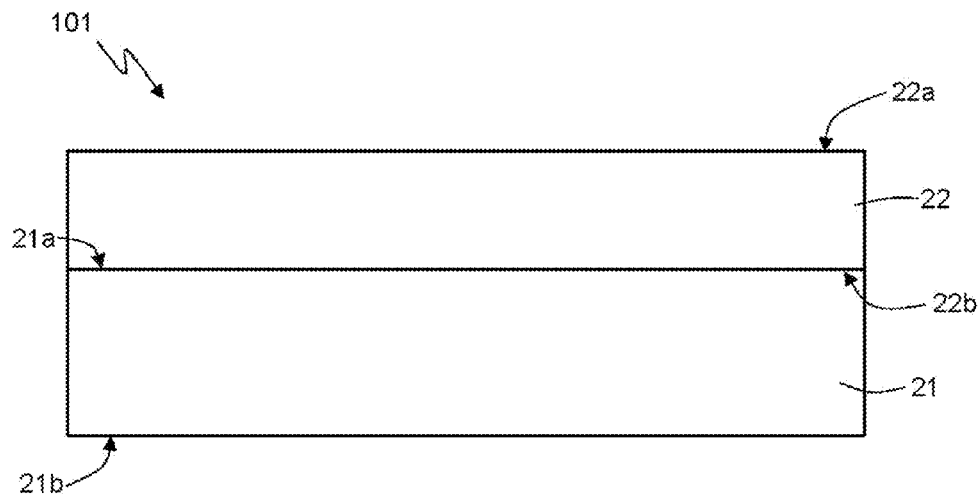
FIGS. 9-15 show, in cross-section, a wafer during steps of a method for manufacturing a free-standing structure, according to an embodiment of the present disclosure.

With reference to FIG. 9, and in analogy regarding that described with reference to FIGS. 7 and 8 (common elements are indicated herein with the same reference numerals), a wafer 100 comprising the substrate 21, of silicon (Si) for example, is provided. The substrate 21 comprises a first and a second surface 21a and 21b opposite to each other. On the first and/or the second surface 21a and 21b of the substrate 21a support layer 22 (in FIG. 9, the support layer 22 extends along the first surface 21a) of silicon oxide ($SiO_2$) is formed, for example, by thermal growth. Alternatively, the support layer 22 is of silicon oxide deposited on the surface 21a using PECVD. The support layer 22 comprises a first and a second surface 22a and 22b opposite to each other. The second surface 22b of the support layer 22 is in direct contact with the first surface 21a of the substrate 21.

Figure 10:
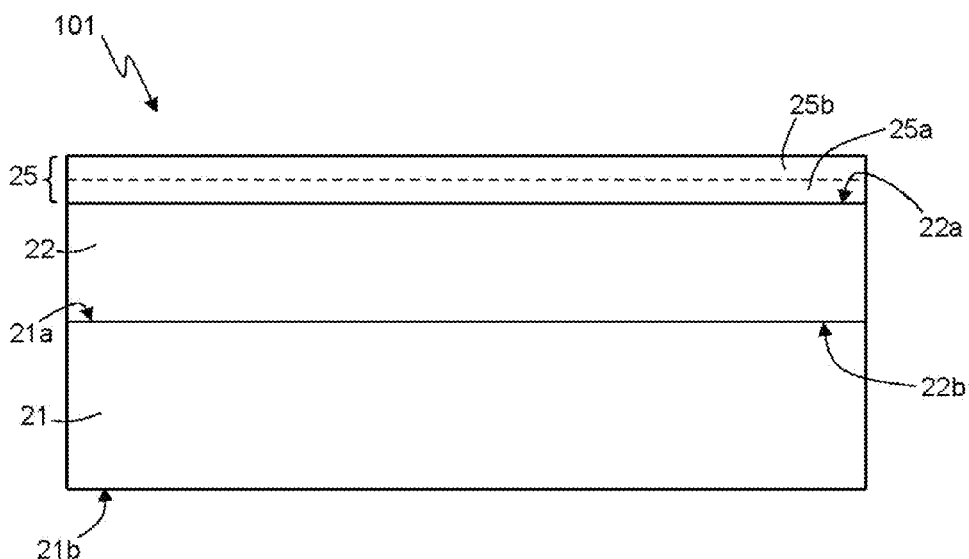

Manufacturing proceeds, FIG. 10, with the steps of forming the protective layer 25 over the first surface 22a of the support layer 22. In the described process steps, the protective layer 25 has, in particular, the function of an etch stop layer, as described in detail hereinafter. The protective layer 25 is therefore a double layer of aluminium oxide ($Al_2O_3$), also known as alumina.

The protective layer 25 is formed according to the above-mentioned steps of:

(i) depositing a first intermediate layer 25a, of aluminium oxide $Al_2O_3$, using an ALD process, (ii) crystallizing the first intermediate layer 25a, (iii) depositing a second intermediate layer 25b, of aluminium oxide $Al_2O_3$, on the crystallized first intermediate layer using an ALD process, and (iv) crystallizing the second intermediate layer 25b.

The first and the second intermediate layers 25a and 25b, together, form the protective layer 25.

The deposition of the first and second layers 25a, 25b of $Al_2O_3$ by ALD is carried out, in particular, according to the steps previously illustrated with reference to FIGS. 7 and 8.

Figure 11:
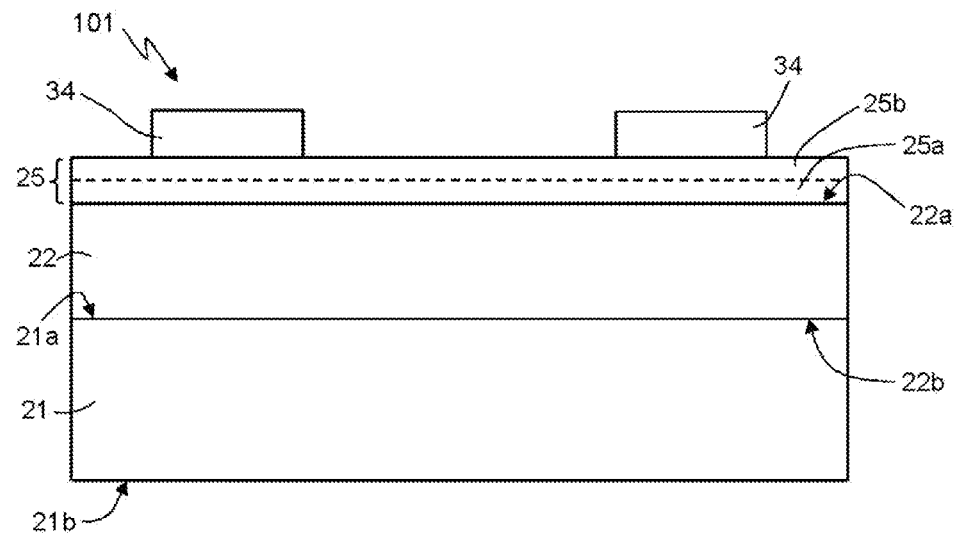

As shown in FIG. 11, after forming the protective layer 25, manufacturing proceeds by forming, over the protective layer 25, an electrical contact layer, for example of doped polysilicon (N-type for example), which is subsequently etched to remove selective portions of the electrical contact layer and form electrical contact regions 34. The etching of the electrical contact layer is carried out by selective polysilicon plasma dry etching on silicon oxide, which selectively removes the polysilicon, but not the protective layer 25.

Figure 12:
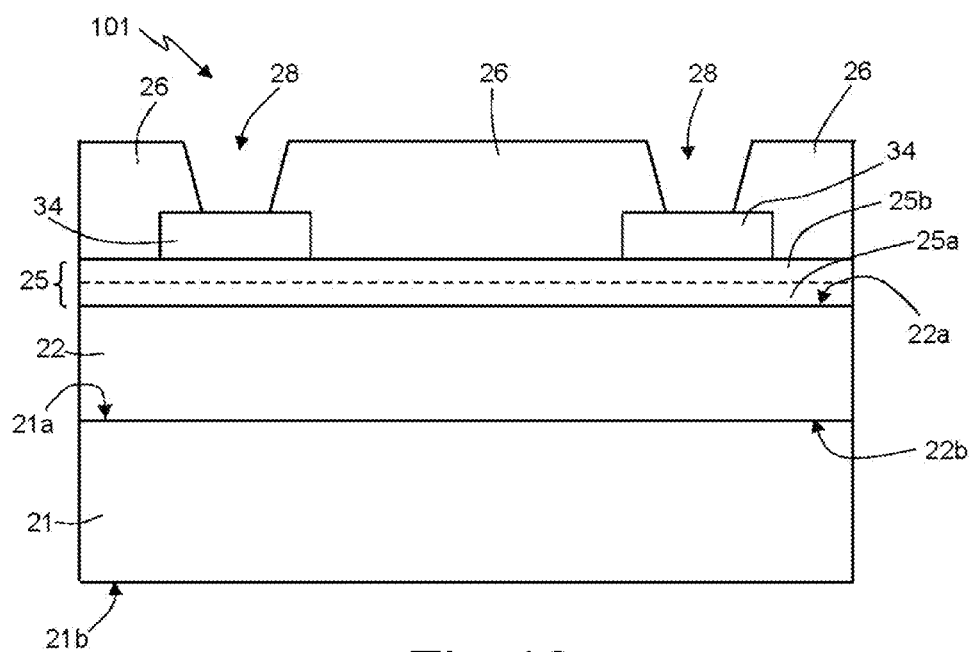

As shown in FIG. 12, a sacrificial layer 26 of silicon oxide (deposited by PECVD) is formed over the protective layer 25 and the electrical contact regions 34. Portions of the sacrificial layer 26 from over the underlying electrical contact regions 34 are removed through lithographic steps and subsequent etching, forming trenches 28 that extend to the electrical contact regions 34, so as to expose the surface of the electrical contact regions 34.

Figure 13:
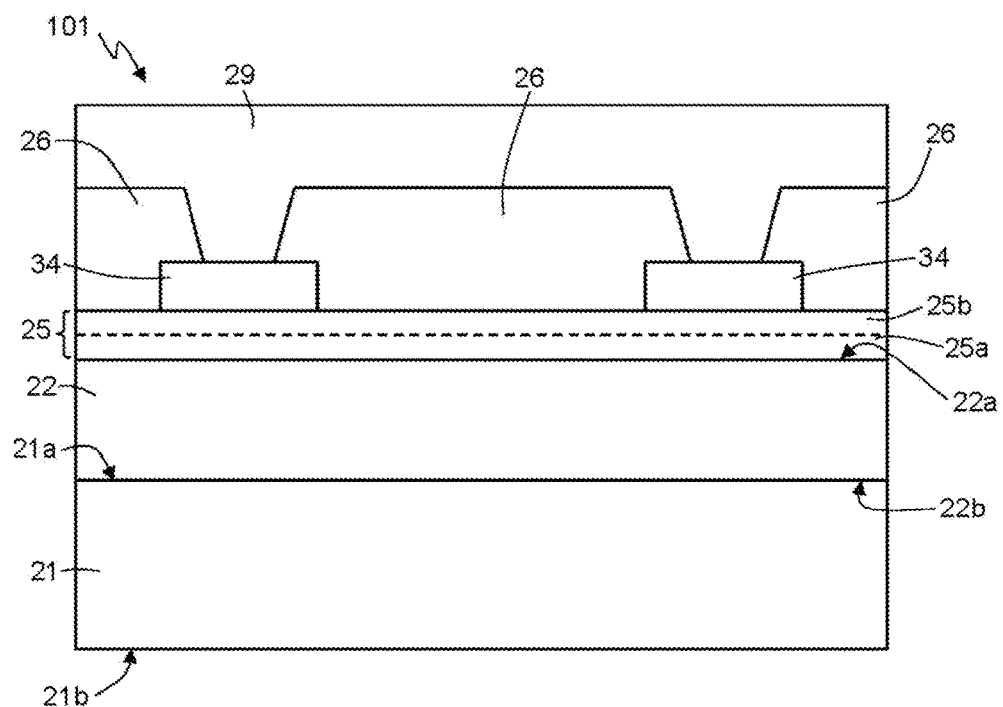

As shown in FIG. 13, a structural layer 29, for example of epitaxially grown polysilicon, is formed over the sacrificial layer 26 and in the trenches 28, which extends in the trenches 28 to make electrical contact with the electrical contact regions 34. The structural layer 29 can be processed as needed, to form surface structures having a desired shape.

Figure 14:
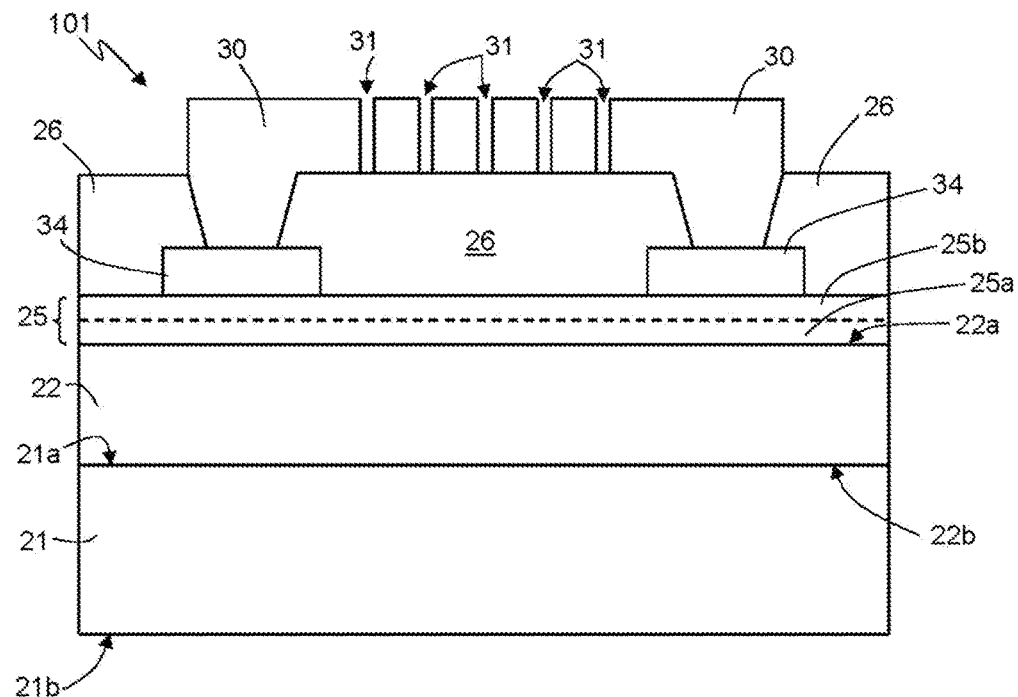

In FIG. 14, the structural layer 29 is selectively etched to remove a portion thereof, so as to form a structure indicated by reference numeral 30. However, it can be noted that in this manufacturing step, the structure 30 is still constrained to the underlying sacrificial layer 26, and therefore is not free to move. Furthermore, a structure 30 having a membrane shape is shown here, but what is described can be extended to any structure that, at the end of the manufacturing steps, is a free-standing or partially free-standing structure, able to oscillate and/or translate and/or perform any other movement in one or more directions.

The structure 30 rests, in this step, on the sacrificial layer 26 (and is in contact with the latter). Through holes 31 are also formed in the structure 30 to enable removal, in a subsequent manufacturing step, of the sacrificial layer 26, so as to form a partially free-standing structure.

Figure 15:
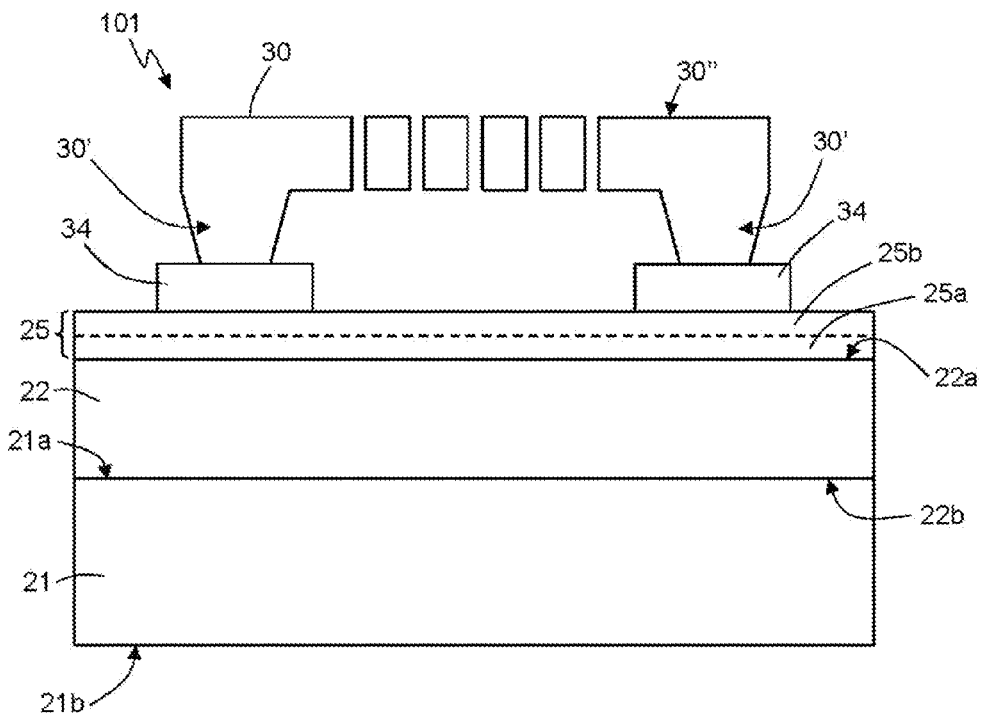

As shown in FIG. 15, the structure 30 is made free-standing (and thus at least partially movable) by removing portions of the sacrificial layer 26 that extend beneath the structure 30. In the description hereinafter, structure 30 is identified as moving structure 30. The removal of the portions of the sacrificial layer 26 is performed by HF vapor phase etching or, in alternative, by wet etching using a solution or mixture comprising HF.

The portion of the structural layer 29 that extends in the trenches 28 in FIG. 15 forms, in FIG. 15, a support base 30' for the moving structure 30 (in contact, and therefore electrical connection, with the underlying electrical contact regions 34), while the portion of the structural layer 29 that extends above the sacrificial layer 26 in FIG. 12 forms, in FIG. 12, a free-standing structure 30".

The HF etching step of the sacrificial layer 26 does not damage the protective layer 25, nor does it penetrate through the protective layer 25. Therefore, the support layer 22 is neither removed nor damaged by the HF etching step of the sacrificial layer 26. Thus, the sacrificial layer 26 can be completely removed.

In cases where it is desired to form deep trenches through the support layer 22, for example for making contact with the substrate 21, the protective layer 25 can be selectively removed by masked etching (or by subsequent lithographic and etching steps) using a plasma dry etch that uses $BCl_3$. Afterwards, it is possible to proceed with etching the support layer 22 using a mixture containing HF (for example, BOE).

Figure 16:
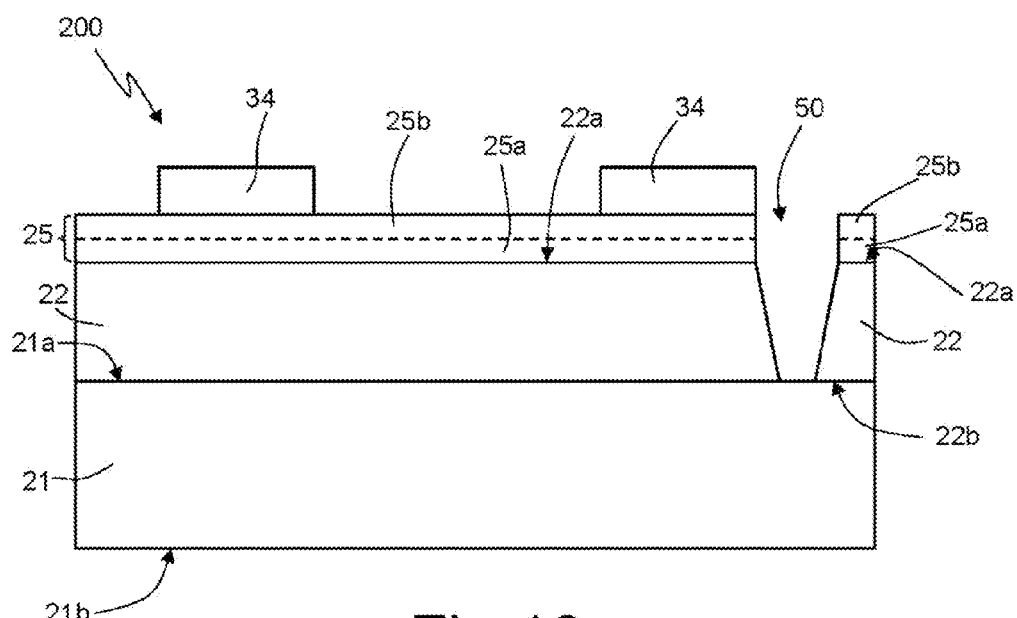
FIG. 16 shows the wafer of FIGS. 9-15 during a further manufacturing step, according to one aspect of the present disclosure.

FIG. 16 shows a wafer 200 (formed according to the manufacturing steps described with reference to FIGS. 9-11) where the protective layer 25 has also been removed from a region in which it is wished to form a deep trench 50 through the support layer 22.

The etching of the protective layer 25 can be carried out, indifferently, either before or after forming the electrical contact regions 34.

According to one embodiment of the present disclosure, the manufacturing steps described with reference to FIGS. 9-16 can be used to manufacture a micro-electro-mechanical sensor (MEMS) or any type of inertial sensor, for example, a gyroscope or an accelerometer. In particular, it clearly emerges that the protective layer 25 can be used as an etch stop layer during the manufacture of any free-standing or semi-free-standing structure, for example beams, micromirrors, diaphragms, cantilevers or any other MEMS structure. FIGS. 17-25 show, in cross-section, an inertial sensor (in particular a gyroscope) according to successive manufacturing steps. Elements of FIGS. 17-25 common to FIGS. 7 and 8, and/or FIGS. 9-16, are identified with the same reference numerals.

With reference to FIG. 17, to make an inertial sensor according to an embodiment of the present disclosure, a wafer 300 comprising the substrate 21, of silicon (Si) for example, having the first and second surfaces 21a and 21b opposite to each other, is provided. The support layer 22 is formed on the first and/or the second surface 21a and 21b of the substrate 21. In FIG. 17, the support layer 22 extends along both the first surface 21a and the second surface 21b; according to a different embodiment, not shown, the support layer 22 extends along the first surface 21a. The support layer 22 is of silicon oxide ($SiO_2$) and, for example, grown thermally. Alternatively, the support layer 22 is made of silicon oxide deposited by a PECVD process. The support layer 22, by extending over the first surface 21a of the substrate 21, exposes its own surface 22a.

Figure 1:
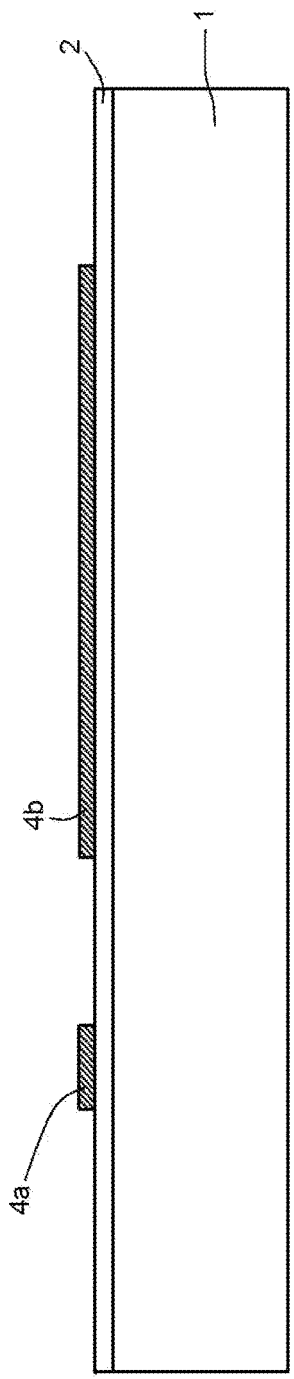
FIGS. 1-6 show, in cross-section, an inertial sensor during manufacturing steps of a method of manufacture according to an embodiment of known type.

Manufacturing proceeds with the formation of an electrical contact layer 32, in particular doped polysilicon (N-type for example), on the surface 22a of the support layer 22. According to the embodiment in FIG. 17, the electrical contact layer 32 is formed on both faces of the wafer 300; however, according to a different embodiment, not shown, the electrical contact layer 32 is formed over surface 22a of the support layer 22. The electrical contact layer 32 that extends over the surface 22a of the support layer 22 is etched to remove selective portions from it and to form electrical contact regions 34a, 34b, similar to electrical contact regions 4a, 4b in FIG. 1, or electrical contact regions 34 in FIG. 11. The etching of the electrical contact layer 32 is carried out with plasma dry etch, which selectively removes the polysilicon.

As shown in FIG. 18, a support layer 35 of silicon oxide is formed over the support layer 22 and the electrical contact regions 34a, 34b. The support layer 35 is formed through deposition using LPCVD or PECVD processes, in particular, by deposition using a PECVD process. The support layer 35 is reduced in thickness (for example, by chemical mechanical planarization, CMP), until the surface of the electrical contact regions 34a, 34b is reached.

As shown in FIG. 19, manufacturing proceeds with the steps of forming the protective layer 25 over the support layer 35 (here having, in particular, the function of an etch stop layer). The protective layer 25 is formed as previously described. In particular, to aid adhesion of the protective layer 25, a layer of silicon oxide layer 37 is formed, of the type already described with reference to FIG. 7 and having the same function.

Figure 2:
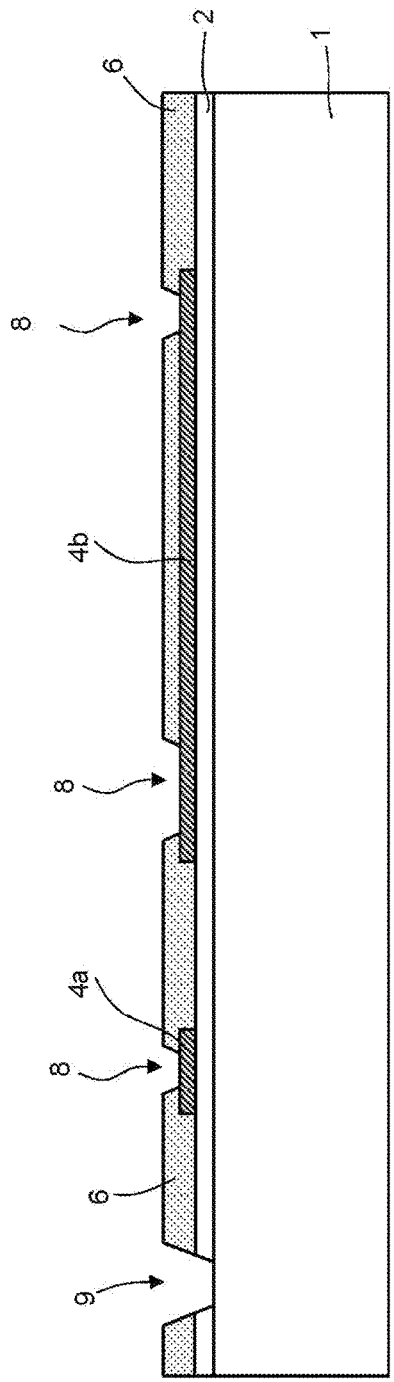
Figure 3:
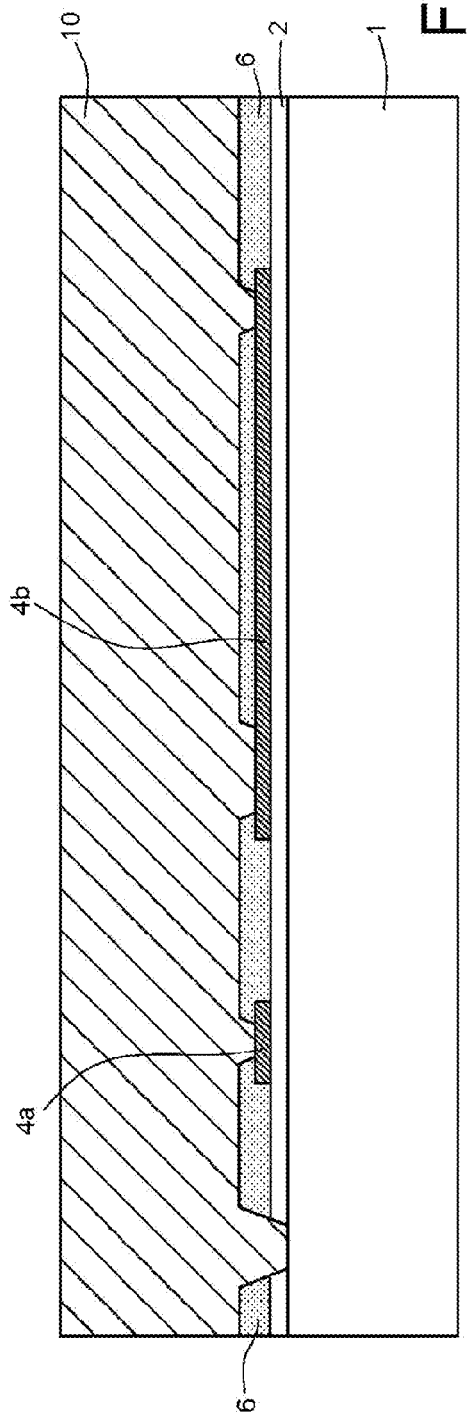
Figure 4:
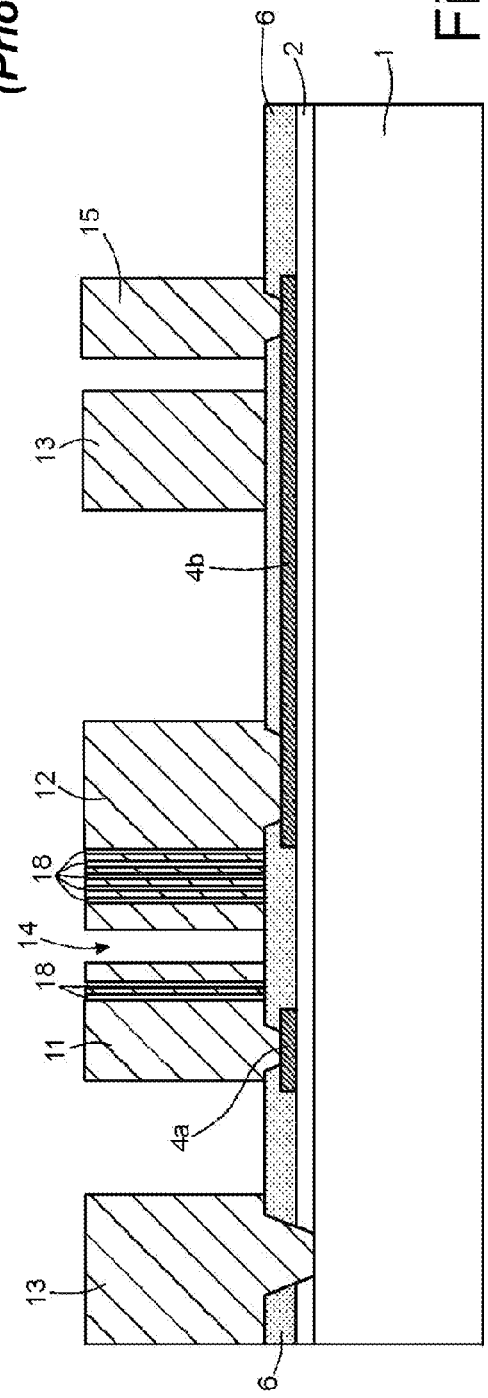

At the end of the formation steps of the etch stop layer 25, an etching step is performed on the protective layer 25 to remove a selective portion of it from the region in which it is wished to form, in subsequent manufacturing steps, a ground contact terminal (see, for example, that already described with reference to the formation of trench 9 and lateral walls 13 in FIGS. 2-4). The etch stop layer 25 can be selectively removed by masked etching using a plasma dry etch that uses $BCl_3$.

As shown in FIG. 20, a sacrificial layer 36, of silicon oxide (deposited by PECVD or TEOS), is formed over the protective layer 25. Through known steps of lithography and etching, for example using hydrofluoric acid (HF), mutually overlaid portions of the sacrificial layer 36, the silicon oxide layer 37, the support layer 35 and the support layer 22 over the surface region of the wafer 300 without the protection of the protective layer 25 are removed. In this way, a trench 33 is formed that extends until it exposes a portion of the surface 21a of the substrate 21. Trench 33 is similar to trench 50 in FIG. 16.

Figure 21:
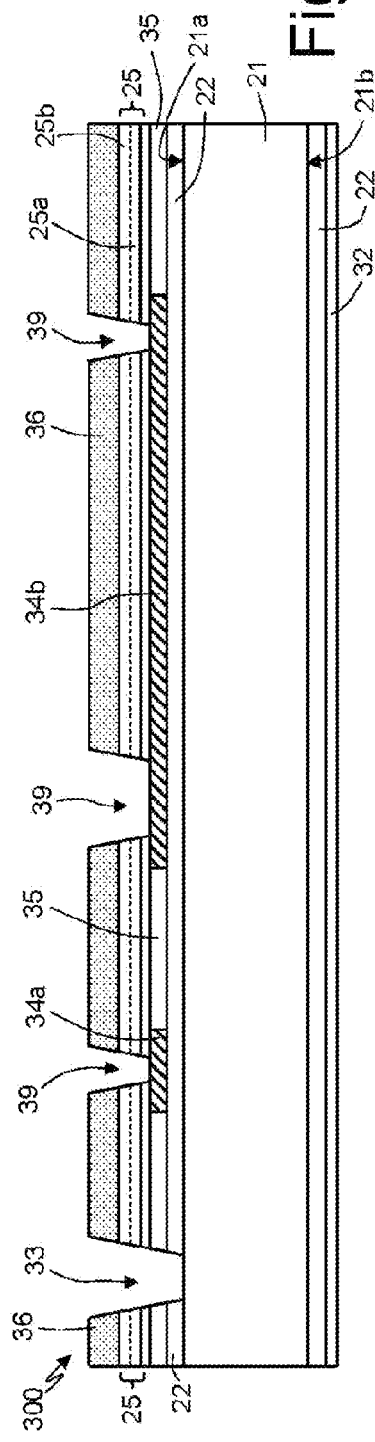

As shown in FIG. 21, steps of lithography and etching are performed on the sacrificial layer 36 and the protective layer 25 to form trenches 39 at the electrical contact regions 34a, 34b. The trenches 39 thus extend through the sacrificial layer 36 and the protective layer 25, until respective surface regions of the electrical contact regions 34a, 34b are exposed. Trenches 39 are similar to trenches 8 in FIG. 2, or trenches 28 in FIG. 12, and have the same function.

According to one embodiment, the formation of trenches 39 is carried out simultaneously with the formation of trench 33.

Figure 22:
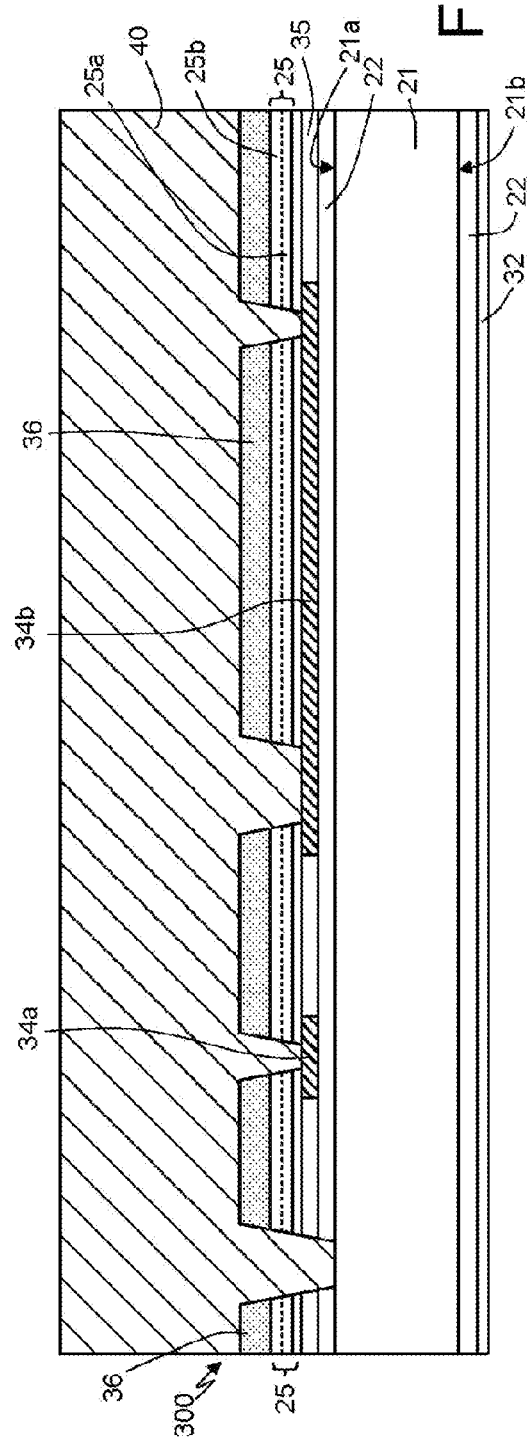

As shown in FIG. 22, a structural layer 40, for example of epitaxially grown polysilicon, is formed over the sacrificial layer 36 and in trenches 33, 39 and extends in trenches 33, 39 to make electrical contact with the substrate 21 (through trench 33) and the electrical contact regions 34a, 34b (through trenches 39). The structural layer 40 can be processed as needed, to form surface structures having a desired shape, in particular to form structures free to oscillate in one or more directions, specific to each inertial sensor.

Figure 23:
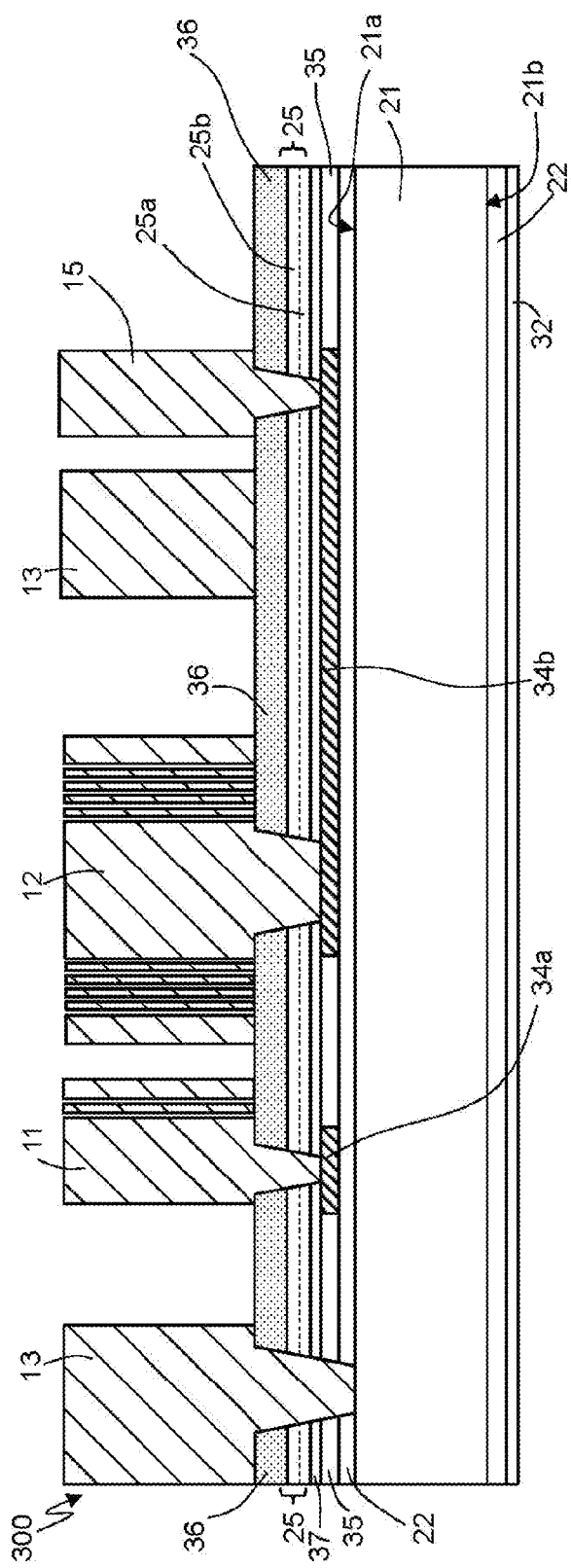

In particular, as shown in FIG. 23, the structural layer 40 is shaped in manner similar to that already described with reference to the structural layer 10 in FIGS. 3 and 4, regarding an embodiment of known type, to form a stator 11 and a rotor 12 of an inertial sensor, in particular a gyroscope. The lateral walls 13 and the electrical contact terminal 15 are also formed. The structure of the stator 11 and the rotor 12 also has through holes 18, through which the etching chemical used to remove the underlying sacrificial layer 36 flows, to release the stator 11 and the rotor 12. The etching of the sacrificial layer 36 is carried out using hydrofluoric acid (HF) in the vapor phase or, alternatively, by wet etching using a solution or mixture comprising HF.

Figure 24:
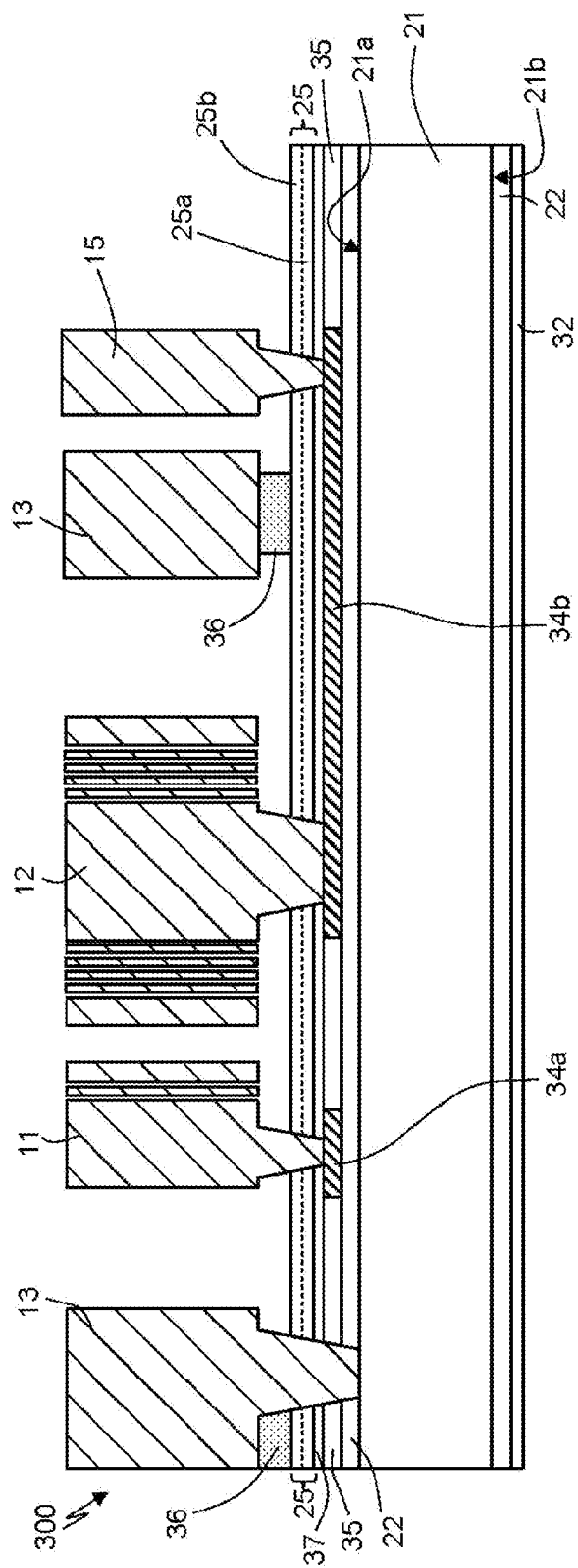

The HF etching step of the sacrificial layer 36 does not damage the protective layer 25, nor does etchant penetrate through the protective layer 25, as discussed above. Therefore, the support layer 22 and the support layer 35 are neither removed nor damaged by etching the sacrificial layer 36 with HF. Instead, the sacrificial layer 36 is completely removed. In this way, the wafer 300 shown in FIG. 24 is obtained.

The layers of support 22 and polysilicon 32 extending along the second surface 21b of the substrate 21 can be removed or kept, as needed.

Further manufacturing steps of the inertial sensor according to the present disclosure comprise forming or providing a cap 41 (similar to cap 19 in FIG. 6) over the lateral walls 13. The formation steps of the cap 41 are, in themselves, known.

Figure 25:
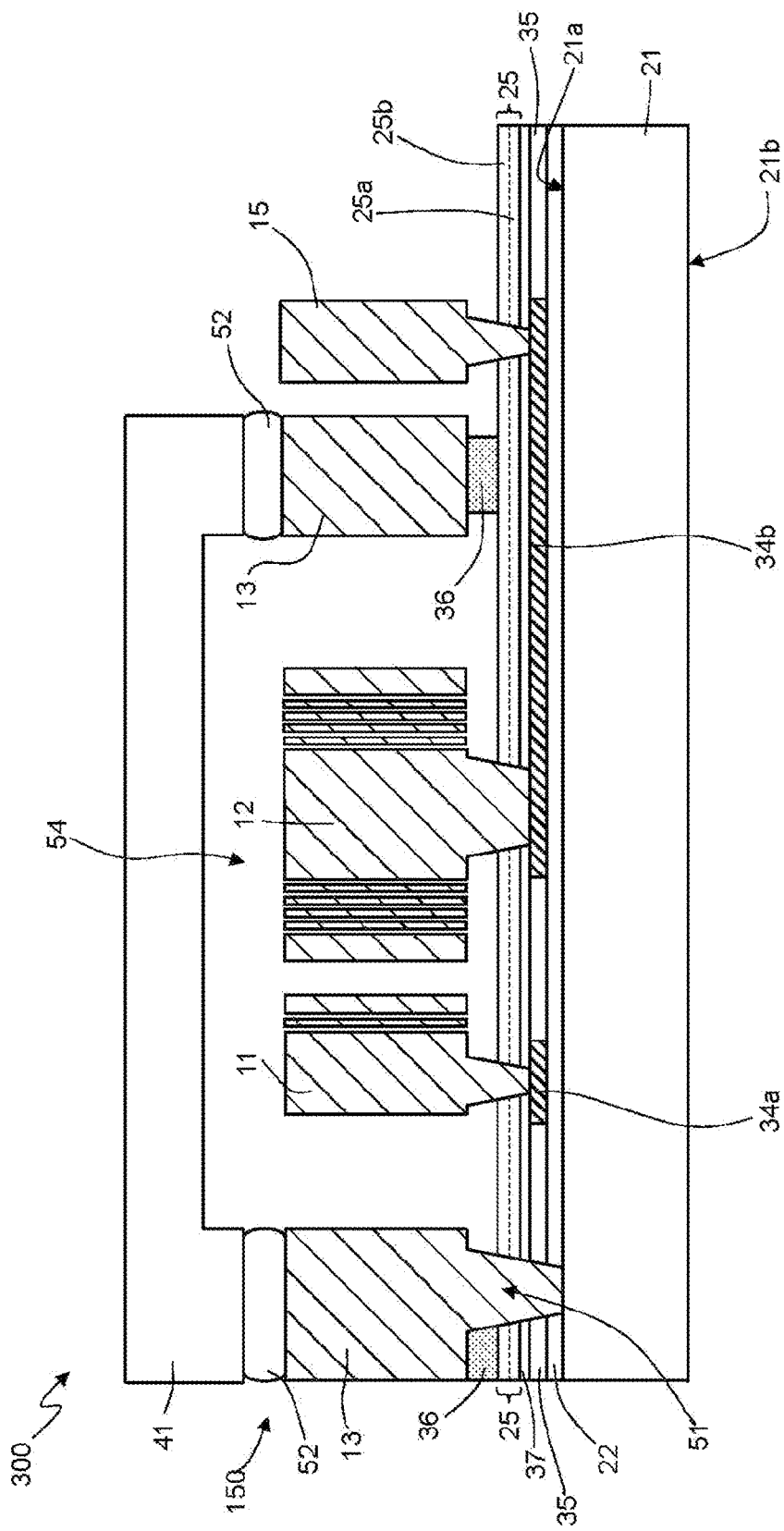

FIG. 25 shows an inertial sensor 150 (in particular a gyroscope) made according to the previously described steps with reference to FIGS. 17-24. In particular, the inertial sensor 150 comprises: the substrate 21, of silicon, having the first surface 21a and the second surface 21b, opposite to each other; the support layer 22, of silicon oxide ($SiO_2$), extending over the first surface 21a of the substrate 21 and in contact with the substrate 21; the support layer 35 and (if present) layer 37, both of silicon oxide ($SiO_2$), in which the electrical contact regions 34a, 34b are buried and which extend to form conductive strips of doped polysilicon N; the protective layer 25, including a double layer 25a, 25b of crystallized aluminium oxide ($Al_2O_3$), formed as previously described and extending over the support layer 35; and free-standing structures movable or semi-movable in one or more directions (stator 11 and rotor 12).

The stator 11 and the rotor 12 are in electrical contact with respective electrical contact regions 34a and 34b, to receive control signals and send measurement signals, according to the known operation of an inertial gyroscope sensor.

In addition, the inertial sensor 150 is housed in a package that comprises lateral walls 13, extending so as to laterally surround the stator 11 and the rotor 12, and insulated from the electrical contact regions 34a, 34b by portions of the sacrificial layer 36; according to one embodiment, the lateral walls 13 are also in electrical contact with the substrate 21 through a vertical contact 51 extending through the sacrificial 36, structural 35, and support 22 layers. In addition, a cap 41 extends on, and in contact with, the lateral walls 13. The cap 41 and the lateral walls 13 are coupled to each other by solder material 52, of the conductive or insulating type according to specifications for the device. In this way, a cavity 54 is defined inside the package that houses and protects the stator 11 and the rotor 12 and, in general, all of the elements (movable and fixed parts) that form the inertial sensor 150. One or more pads or conductive terminals 15 are present outside the cavity 54 and electrically connected to the electrical contact regions 34a, 34b to receive/feed electrical signals from/to the stator 11 and the rotor 12.

By forming the protective layer 25, according to the present disclosure, the stator 11 and rotor 12 extend in contact with the electrical contact regions 34a, 34b without any of the drawbacks described with reference to the background art (see, for example, previously described FIGS. 5 and 6). The advantages are particularly evident in the case of a gyroscope, as the presence of movable structures is a cause of considerable stress for the support structures that sustain the movable structures. That which has been stated herein is valid for any type of MEMS device with parts in movement, for example accelerometers.

Figure 26:
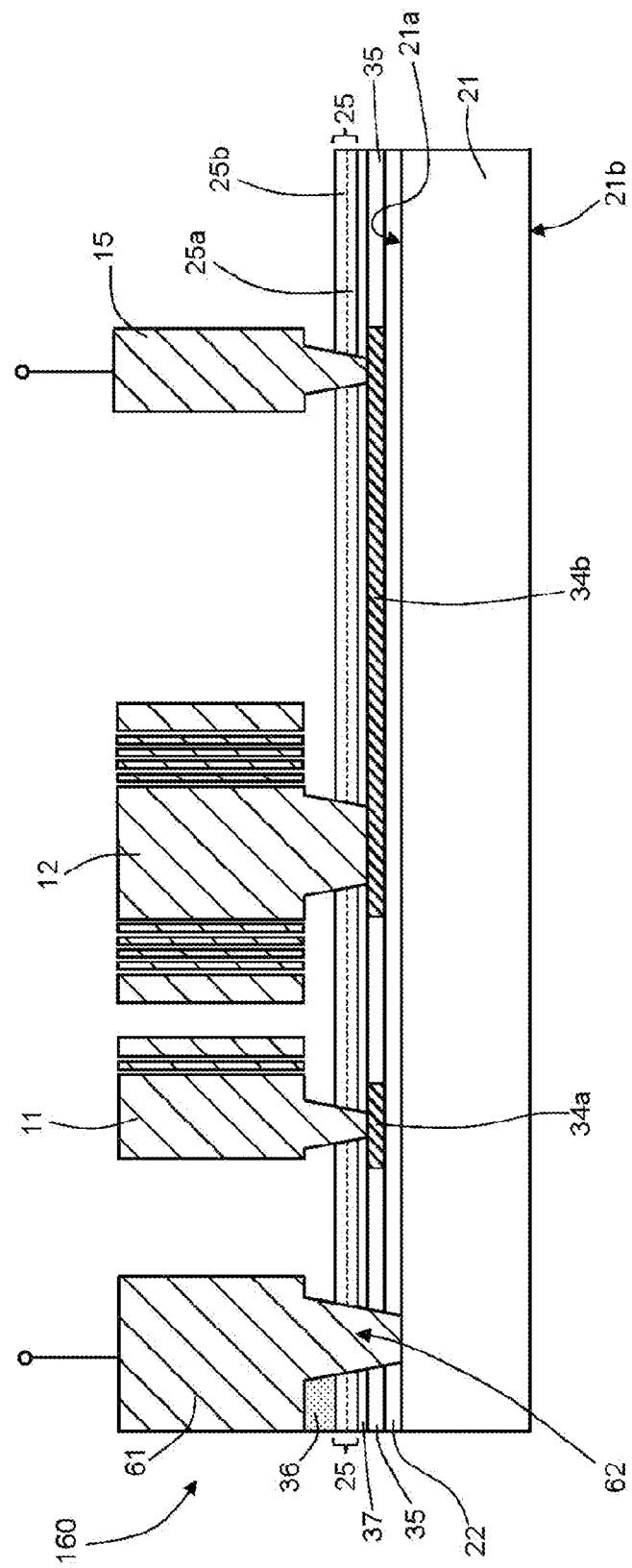
FIG. 26 shows an inertial sensor manufactured according to a variant of the steps in FIGS. 17-25.

FIG. 26 shows an inertial sensor 160 according to a further embodiment of the present disclosure. The inertial sensor 160 is manufactured according to the steps in FIGS. 17-24. Unlike the inertial sensor 150 in FIG. 25, inertial sensor 160 is not equipped with a package formed in an integrated manner. In this case, the lateral walls 13 are not present. Instead, the inertial sensor 160 has a further pad or electrical contact terminal 61 electrically connected to the substrate 21 by a vertical contact 62 extending through the sacrificial 36, structural 35, and support 22 layers. The vertical contact 62 is made in a similar manner to that described for the vertical contact 51 in FIG. 25. The electrical contact terminal 61 is a terminal that supplies a ground reference voltage.

According to a further embodiment of the inertial sensor according to the present disclosure, not shown in Figure, the vertical contact 51 for electrically connecting the lateral walls 13 to the substrate 21 is not present.

According to one embodiment of the inertial sensor according to the present disclosure, the lateral walls 13 extend uninterruptedly around the stator 11 and the rotor 12. According to a different embodiment of the inertial sensor of the present disclosure, the lateral walls 13 can have interruptions or openings, according to specifications for the device.

FIGS. 27-30 show the manufacturing steps of an inertial sensor according to a further embodiment of the present disclosure.

According to this further embodiment, a wafer 400 processed as already described for wafer 300 with reference to FIGS. 17 and 18 is provided. These steps are not described any further, while elements common to wafers 300 and 400 are indicated with the same reference numerals.

With reference to FIG. 27, manufacturing proceeds with the steps of forming, over the support layer 35, a protective layer 125, including a double layer 125a, 125b of crystallized aluminium oxide ($Al_2O_3$), formed according to the steps already described for the protective layer 25.

According to the embodiment in FIG. 27, the etch stop layer 125 is selectively removed from the region where, in subsequent manufacturing steps, the ground terminal in contact with the substrate 21 will be made and from the electrical contact regions 34a, 34b. In other words, the etch stop layer 125 extends on the wafer 400 over the support layer 35 to cover and protect it (excluding, if desired, the regions of the latter that is removed in subsequent manufacturing steps), but does not extend completely over the electrical contact regions 34a, 34b. If desired, safety zones can be provided at the borders between the electrical contact regions 34a, 34b and the support layer 35, where the etch stop layer 125 also extends over the electrical contact regions 34a, 34b.

As shown in FIG. 28, manufacturing proceeds with the formation of the sacrificial layer 36, as described with reference to FIG. 20. Afterwards, the trenches 63, 64 are formed in the region in which it is desired to form the ground terminal (trench 63) and in the electrical contact regions 34a, 34b (trenches 64). Trenches 64 are similar to trenches 39 in FIG. 21. In some embodiments, the trenches 64 are not formed by etching and removing selective portions of the etch stop layer 125 and they do not extend to the electrical contact regions 34a, 34b. Trenches 64 are thus formed by etching the sacrificial layer 36 and the oxide layer 37 (if present). The formation of trenches 63 and 64 can take place at the same time, or in different steps, as already described in the foregoing with reference to trenches 33 and 39.

Figure 29:
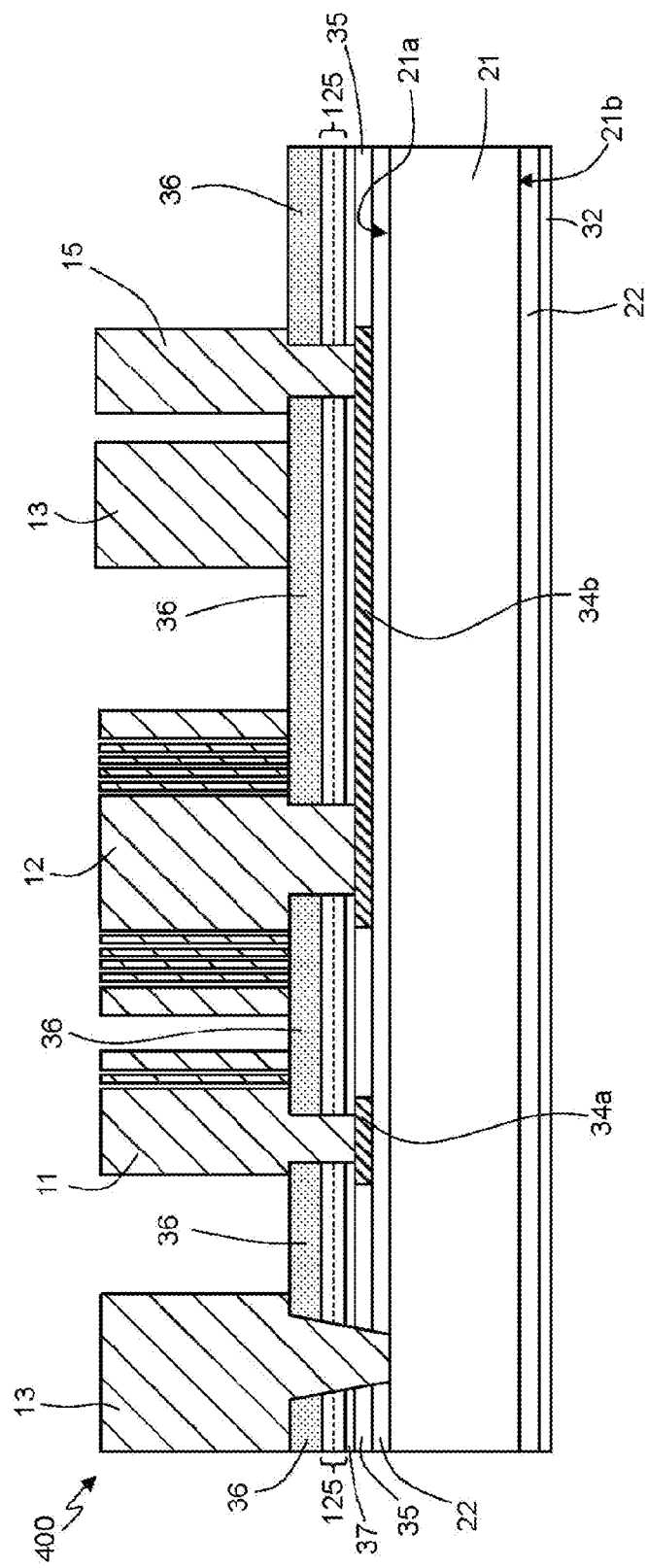

Following this, FIG. 29, a structural layer 140 is formed over the sacrificial layer 36 and in the trenches 63, 64 in a similar manner to the structural layer 40 in FIG. 22. The structural layer 140 is, for example, of epitaxially grown polysilicon. The structural layer 140 can be processed as needed, to form surface structures having a desired shape, in particular to form structures free to oscillate in one or more directions, specific to each inertial sensor.

In particular, as shown in FIG. 29, the structural layer 140 is shaped in a similar manner to that already described with reference to FIGS. 4, 23 and 24, to form a stator 11 and a rotor 12 of an inertial sensor 170, in particular a gyroscope.

The structure of the stator 11 and the rotor 12 also has through holes 18, through which the etching chemical used to remove the underlying sacrificial layer 36 flows, in order to release the stator 11 and the rotor 12. The etching of the sacrificial layer 36 is carried out using hydrofluoric acid (HF in the vapor phase or, alternatively, by wet etching using a solution or mixture comprising HF. In this case, etching of the sacrificial layer 36 with HF does not remove the support layer 35, as it is protected by the etch stop layer 125, nor the electrical contact regions 34a, 34b, as HF does not remove polysilicon.

Figure 30:
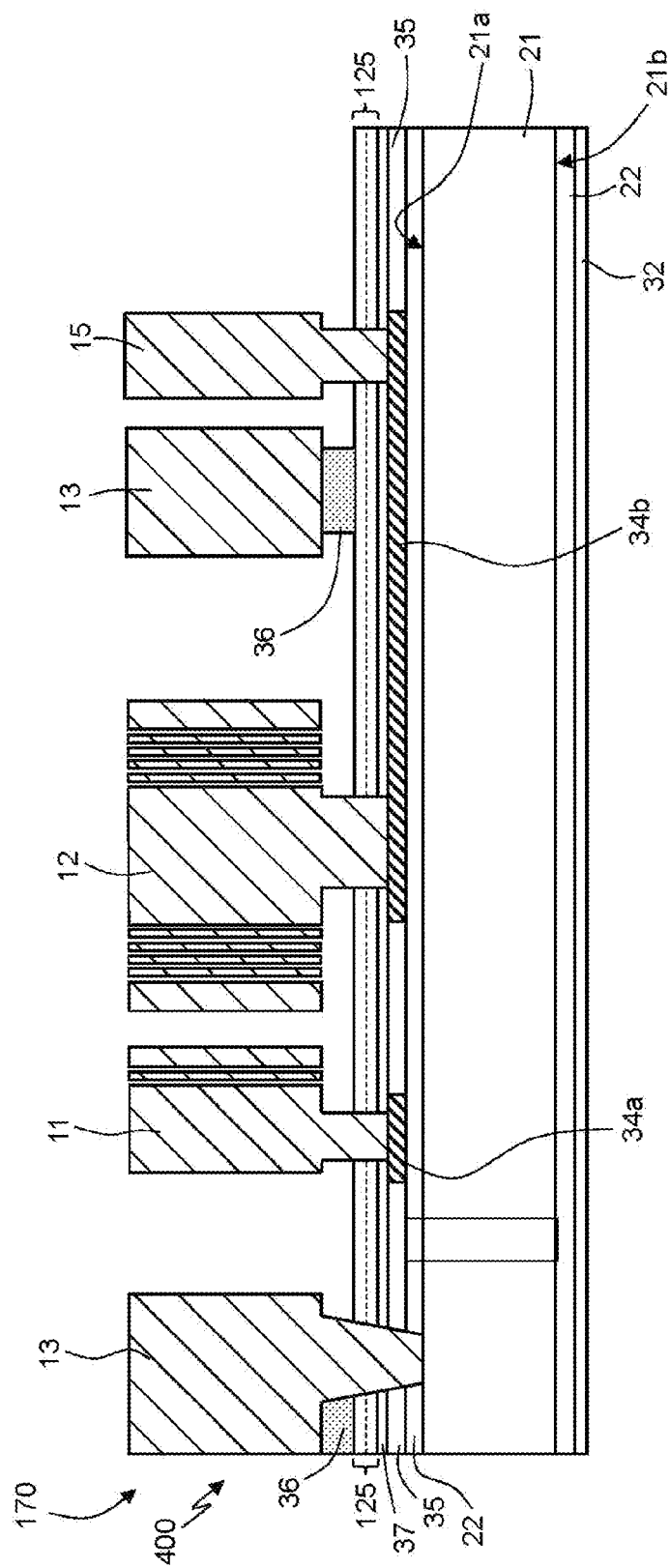

The formation steps of the inertial sensor can proceed as already shown and described with reference to FIG. 25 or, alternatively, with reference to FIG. 26 (in this last case, the walls 13 of FIG. 30 are not present).

Figure 31:
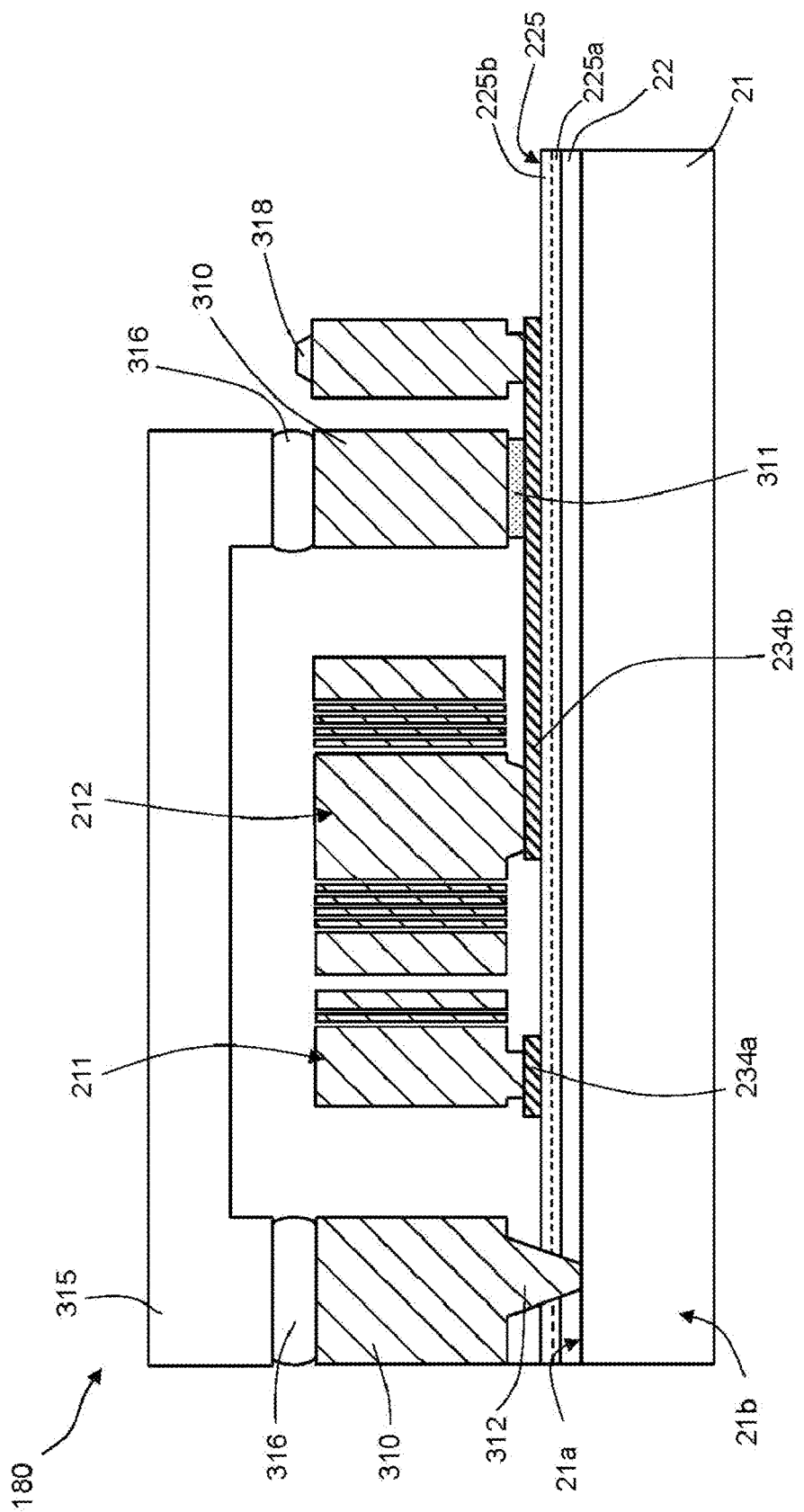
FIG. 31 shows, in cross-section, an inertial sensor according to a further embodiment of the present disclosure.

FIG. 31 shows an inertial sensor 180, in particular a gyroscope, according to a further embodiment of the present disclosure.

The inertial sensor 180 comprises, in analogy with the inertial sensor 150: the substrate 21, of silicon for example, having a first surface 21a and a second surface 21b, opposite to each other; the support layer 22, of silicon oxide ($SiO_2$), extending over the first surface 21a of the substrate 21 and in contact with the substrate 21; a protective layer 225, of alumina ($Al_2O_3$), formed similarly to that previously described with reference to the protective layer 25 (FIGS. 7 and 8) and extending over the support layer 22; a plurality of electrical contact regions 234a, 234b (similar to, and having the same function as, electrical contact regions 34a, 34b), of a conductive material, extending over the protective layer 225; and free-standing structures movable in one or more directions (stator 211 and rotor 212).

The stator 211 and the rotor 212 are in electrical contact with respective electrical contact regions 234a, 234b to receive control signals and send measurement signals, according to the known operation of a gyroscope. The stator 211 and the rotor 212 are, for example, of polysilicon, epitaxially grown and shaped according to the previously described steps to form the stator 11 and the rotor 12.

It can be noted that, according to the embodiment in FIG. 31, the electrical contact regions 234a, 234b (as said, having a similar function to regions 34a and 34b in FIG. 25) extend over the protective layer 225. Therefore, according to this embodiment, the step of etching the protective layer 225 to form access trenches to the electrical contact regions is not contemplated, but provision is instead made to fabricate, for example, the inertial sensor in FIG. 25.

The inertial sensor 180 is housed in a package that comprises lateral walls 310, extending so as to laterally surround the stator 211 and the rotor 212, and insulated from the electrical contact regions 234a, 234b by electrical insulation regions 311. The lateral walls 310 can optionally be in electrical contact with the substrate 21 through a vertical contact 312 extending through the etch stop layer 225 and the support layer 22. In addition, a cap 315 extends on, and in contact with, the lateral walls 310. The cap 315 and the lateral walls 310 are coupled to each other by solder material 316, of the conductive or insulating type according to needs. In this way, an internal cavity is defined that houses and protects the stator 211 and the rotor 212 and, in general, all of the elements (movable and fixed parts) that form the inertial sensor 180. One or more conductive pads 318 are present outside the cavity and electrically connected to the electrical contact region 234a, 234b (only one is shown in the figure) to receive/feed electrical signals from/to the stator 211 and rotor 212.

By forming the etch stop layer 225, according to the embodiment in FIG. 31, the support layer 22 is not etched or damaged by previous manufacturing steps, and the stator 211 and rotor 212 are supported by regions devoid of the drawbacks described with reference to the background art.

From examination of the characteristics of the embodiments according to the present disclosure, the advantages that can be achieved with the disclosure are evident.

An etch stop layer formed as described according to the present disclosure is, in particular, impermeable to hydrofluoric acid (HF) and therefore offers complete protection to underlying layers that could be damaged by hydrofluoric acid. Furthermore, it exhibits excellent properties of adhesion to layers of silicon oxide, excellent dielectric properties and high compatibility with high-temperature thermal processes.

By avoiding the problems of etching the oxide of the structural layer that extends between the substrate of silicon and the electrical contacts of polysilicon as described with reference to the background art, it is possible to obtain structures that are stable and not subject to breakage, increasing the reliability of devices manufactured in this way.

Furthermore, the present disclosure does not require the use of expensive materials or difficult processing.

Other advantages include: reduction in the width and pitch of the electrical contact regions 4, with consequent rescaling of the final device or system; simplification of the layout, which does not need to take into account the under-etch sizes mentioned with reference to the background art; and significant reduction in the release times of the moving structure that forms the stator 11 and rotor 12, oxide from the sacrificial layer 36 is removed (and not oxide from the underlying structural layer as well), with consequent benefits with regard to manufacturing costs.

Figure 5:
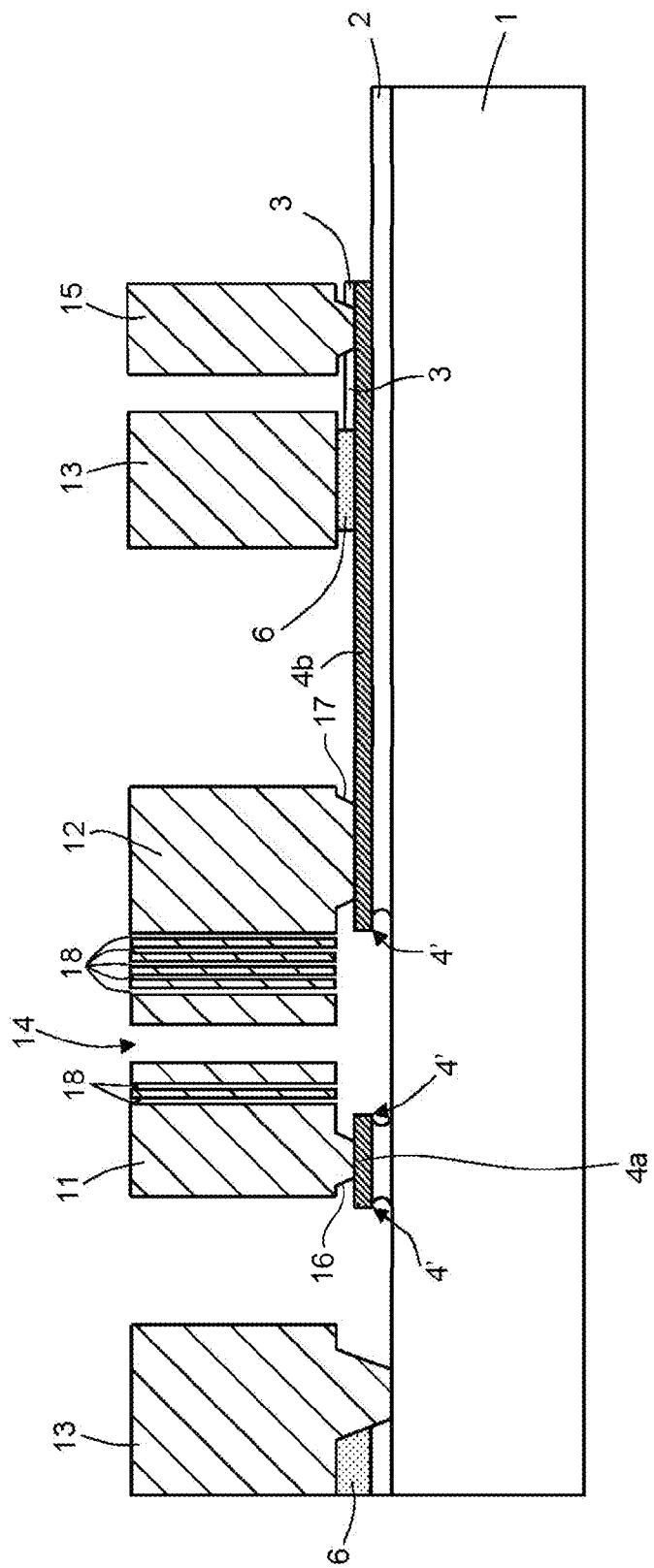
Figure 6:
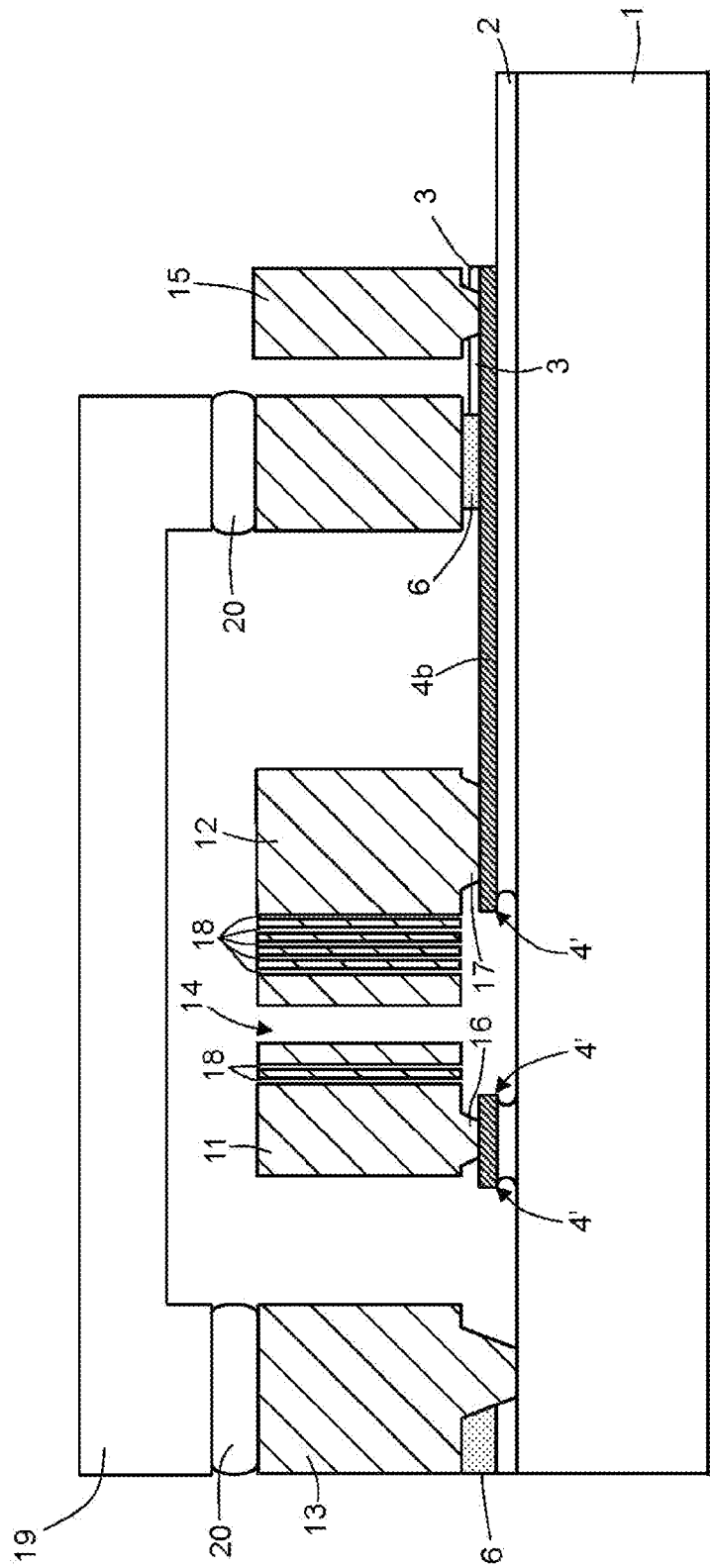

A further advantage of the present disclosure resides in the fact that protective regions in silicon nitride, of the type shown in FIGS. 5 and 6 with reference numeral 3, are not needed and thus may be eliminated. In fact, according to the present disclosure, the electrical contact regions 34a, 34b are protected from the outside environment by the etch stop layer 25, 125. This brings the advantage of a reduction in the costs of the manufacturing process.

Furthermore, the potentially fragile free-standing parts of polysilicon are eliminated.

In addition, the applicant has verified that the layer 25, 125 of alumina ($Al_2O_3$) is a conformal layer with low roughness. In this way, the roughness of the electrical contact regions 34a, 34 is not altered.

Finally, it is evident that modifications and variations can be applied to that described herein without leaving the scope of protection of the present disclosure.

One or more embodiments directed to the utilization of a double layer of crystallized $Al_2O_3$, obtained as described with reference to the protective layer 25, with the aim of protecting underlying layers from hydrofluoric acid is applicable, in general, for protecting any material liable to being removed or damaged during etching steps using hydrofluoric acid (HF). For example, the previously described support layer 22 can be of a different material from silicon oxide, such as silicon nitride (SiN), oxynitrides, doped oxides (BPSG, PSG), etc.

In addition, the electrical contact regions 34, or 34a and 34b, or 234a and 234b, can be omitted in the case where the MEMS device does not utilize electrical control signals or does not generate electrical signals indicative of a measured quantity (for example, a displacement in the case of a gyroscope). In this case, the moving structure rests directly on the protective layer 25, or on a possible further intermediate layer.

Furthermore, according to the embodiments in FIGS. 17-25 and/or FIG. 26, the electrical contact regions 34a, 34b can be of a material different from polysilicon. In particular, the electrical contact regions 34a, 34b could be of any conductive material, even etchable with hydrofluoric acid (HF). In the case of the embodiments according to FIGS. 27-30 and FIG. 31, the electrical contact regions 34a, 34b, and 234a, 234b, respectively, could be of conductive materials different from doped polysilicon, provided that this material is not removed by hydrofluoric acid.

In addition, the protective layer 25, 125, 225 can be formed by more than two overlaid intermediate layers of crystallized aluminium oxide (in any case, formed according to the previously described method).

Furthermore, the conductive regions 34, or 34a, 34b, or 234a, 234b, according to the respective embodiments, can be more or less than two; in particular, according to device specifications, just one conductive region or a multiplicity of more than two conductive regions can be present.

Similarly, the movable masses 11, 12 and 211, 212 (stator and rotor in the respective embodiments described) can be more than two, or, alternatively, just one movable mass can be provided.

Finally, it should be noted that a protective layer in aluminium oxide, made as previously described, can be used as an etch stop layer during the manufacturing steps of any semiconductor device, for example MEMS devices, and/or (micro)electronic devices, and/or (micro-)mechanical devices, in particular devices made using MEMS micromachining techniques.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor device, comprising:
   a substrate having a first surface and a second, opposing surface;
   a structural layer of a first material that is at least one of etchable and damageable by hydrofluoric acid over the first surface of the substrate;
   at least one electrical interconnection region located at least partially over the structural layer for electrical coupling with a free-standing structure;
   a support layer made of a second material that is at least one of etchable or damageable by hydrofluoric acid, wherein the support layer is coplanar with the at least one electrical interconnection region;
   a protective layer over the at least one electrical interconnection region and the support layer, the protective layer including a first intermediate protective layer of crystallized aluminum oxide and a second intermediate protective layer of crystallized aluminum oxide over the first intermediate protective layer;
   a structural region at least partially free-standing above the first surface of the substrate over the protective layer and electrically coupled to the at least one electrical interconnection region; and
   a trench through the protective layer, the support layer and the structural layer for grounding the free-standing structure by electrical contact with the substrate, the trench being formed in a region not covered by the at least one electrical interconnection region, and the trench being formed in part by etching the structural layer using hydrofluoric acid.

2. The semiconductor device according to claim 1, wherein said structural layer is made of a material chosen from a group comprising at least one of silicon oxide, silicon nitride, oxynitrides and doped oxides.

3. The semiconductor device according to claim 1, wherein said second intermediate protective layer is in direct contact with the first intermediate protective layer.

4. The semiconductor device according to claim 1 wherein the at least one electrical interconnection region is made of doped polysilicon.

5. The semiconductor device according to claim 1, wherein the semiconductor device is at least one of an electronic device, a micro-mechanical device, a microelectronic device and a micro-electro-mechanical device.

6. The semiconductor device according to claim 1, wherein said semiconductor device is an inertial sensor, the structural region being a movable mass of said inertial sensor.

7. The semiconductor device according to claim 1, wherein the protective layer is over the at least one electrical interconnection region and covers the at least one electrical interconnection region.

8. The semiconductor device according to claim 1, wherein the structural region includes an anchorage portion extending through the structural region and the protective layer.

9. The semiconductor device according to claim 1, wherein the protective layer is located partially over the at least one electrical interconnection region and one or more portions of the at least one electrical interconnection region are not covered by the protective layer.

10. The semiconductor device according to claim 9, wherein the structural region includes an anchorage portion electrically coupled to a surface portion of the at least one electrical interconnection region that is not covered by the protective layer.

11. The semiconductor device according to claim 1, wherein the protective layer is resistant to hydrofluoric acid and etchable by dry etch processing.

12. A method comprising:
forming a substrate having a first surface and a second, opposing surface;
forming a structural layer of a first material that is at least one of etchable and damageable by hydrofluoric acid over the first surface of the substrate;
forming at least one electrical interconnection region partially over the structural layer for electrical coupling with a free-standing structure;
forming a support layer made of a second material that is at least one of etchable or damageable by hydrofluoric acid, wherein the support layer is coplanar with the at least one electrical interconnection region;
forming a protective layer, the protective layer including a first intermediate protective layer of crystallized aluminum oxide and a second intermediate protective layer of crystallized aluminum oxide over the first intermediate protective layer;
forming a structural region at least partially free-standing above the first surface of the substrate over the protective layer and electrically coupled to the at least one electrical interconnection region; and
forming a trench through the protective layer, the support layer and the structural layer for grounding the free-standing structure by electrical contact with the substrate, the trench being formed in a region not covered by the at least one electrical interconnection region, and the trench being formed in part by etching the structural layer using hydrofluoric acid.

13. The method according to claim 12, wherein the protective layer is resistant to hydrofluoric acid and etchable by dry etch processing.

14. A semiconductor device, comprising:
a substrate having a first surface and a second, opposing surface;
a structural layer of a first material that is at least one of etchable and damageable by hydrofluoric acid over the first surface of the substrate;
at least one electrical interconnection region located at least partially over the structural layer for electrical coupling with a free-standing structure;
a support layer made of a second material that is at least one of etchable or damageable by hydrofluoric acid, wherein the support layer is coplanar with the at least one electrical interconnection region;
a protective layer, the protective layer including a first intermediate protective layer of crystallized aluminum oxide and a second intermediate protective layer of crystallized aluminum oxide over the first intermediate protective layer;
a structural region at least partially free-standing above the first surface of the substrate over the protective layer and electrically coupled to the at least one electrical interconnection region; and
a trench through the protective layer, the support layer and the structural layer, the trench being formed in part by etching the structural layer using hydrofluoric acid.

15. The semiconductor device according to claim 14, wherein said structural layer is made of a material chosen from a group comprising at least one of silicon oxide, silicon nitride, oxynitrides and doped oxides.

16. The semiconductor device according to claim 14, wherein said second intermediate protective layer is in direct contact with the first intermediate protective layer.

17. The semiconductor device according to claim 14 wherein the at least one electrical interconnection region is made of doped polysilicon.

18. The semiconductor device according to claim 14, wherein the semiconductor device is at least one of an electronic device, a micro-mechanical device, a microelectronic device and a micro-electro-mechanical device.

19. The semiconductor device according to claim 14, wherein the semiconductor device is an inertial sensor, the structural region being a movable mass of the inertial sensor.

* * * * *